(12) United States Patent
Dasari

(10) Patent No.: US 9,747,393 B2
(45) Date of Patent: Aug. 29, 2017

(54) METHODS AND SYSTEMS FOR UPSCALING MECHANICAL PROPERTIES OF GEOMATERIALS

(75) Inventor: Ganeswara Dasari, Pearland, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 1056 days.

(21) Appl. No.: 13/976,357

(22) PCT Filed: Nov. 2, 2011

(86) PCT No.: PCT/US2011/058987
§ 371 (c)(1),
(2), (4) Date: Jun. 26, 2013

(87) PCT Pub. No.: WO2012/108917
PCT Pub. Date: Aug. 16, 2012

(65) Prior Publication Data
US 2013/0311158 A1    Nov. 21, 2013

Related U.S. Application Data

(60) Provisional application No. 61/441,182, filed on Feb. 9, 2011.

(51) Int. Cl.
*G06F 17/50* (2006.01)
*G01V 99/00* (2009.01)

(52) U.S. Cl.
CPC ........ *G06F 17/5009* (2013.01); *G01V 99/005* (2013.01)

(58) Field of Classification Search
CPC ...... G06F 17/5086; G06F 11/30; G06F 19/24; G01V 99/005; G01V 1/003; G01V 1/28; E21B 43/00

(Continued)

(56) References Cited

U.S. PATENT DOCUMENTS

| 6,106,561 A | 8/2000 | Farmer |
| 6,370,491 B1 | 4/2002 | Malthe-Sorenssen et al. |

(Continued)

FOREIGN PATENT DOCUMENTS

| WO | WO 03/100463 | 12/2003 |
| WO | WO 2009/029135 | 3/2009 |

OTHER PUBLICATIONS

Thomas Y. Hou et al., "A Multiscale Finite Element Method for Elliptic Problems in Composite Materials and Porous Media", Journal of Computational Physics, vol. 134, pp. 169-189 (1997).

(Continued)

*Primary Examiner* — Thai Phan
(74) *Attorney, Agent, or Firm* — ExxonMobil Upstream Research Company—Law Department

(57) ABSTRACT

There is provided a method for modelling a hydrocarbon reservoir that includes generating a reservoir model that has a plurality of sub regions. A solution surrogate is obtained for a sub region by searching a database of existing solution surrogates to obtain an approximate solution surrogate based on a comparison of physical, geometrical, or numerical parameters of the sub region with physical, geometrical, or numerical parameters associated with the existing surrogate solutions in the database. If an approximate solution surrogate does not exist in the database, the sub region is simulated using a training simulation to obtain a set of training parameters comprising state variables and boundary conditions of the sub region. A machine learning algorithm is used to obtain a new solution surrogate based on the set of training parameters. The hydrocarbon reservoir can be simulated using the solution surrogate obtained for the at least one sub region.

25 Claims, 19 Drawing Sheets

(58) Field of Classification Search
USPC .......................................... 703/6, 7, 9, 10, 2
See application file for complete search history.

(56) References Cited

U.S. PATENT DOCUMENTS

| | | | |
|---|---|---|---|
| 7,027,964 B2 | 4/2006 | Kennon | |
| 7,031,891 B2 | 4/2006 | Malthe-Sorenssen et al. | |
| 7,043,410 B2 | 5/2006 | Malthe-Sorenssen et al. | |
| 7,089,166 B2 | 8/2006 | Malthe-Sorenssen et al. | |
| 7,188,058 B2 | 3/2007 | Hardy et al. | |
| 7,224,162 B2 | 5/2007 | Proett et al. | |
| 7,739,084 B2* | 6/2010 | Chow | G05B 17/02 702/13 |
| 7,860,654 B2 | 12/2010 | Stone | |
| 2002/0077795 A1 | 6/2002 | Woods et al. | |
| 2003/0216897 A1 | 11/2003 | Endres et al. | |
| 2005/0234690 A1 | 10/2005 | Mainguy et al. | |
| 2006/0253759 A1 | 11/2006 | Wei | |
| 2008/0015784 A1 | 1/2008 | Dorn et al. | |
| 2008/0071505 A1 | 3/2008 | Huang et al. | |
| 2008/0165619 A1 | 7/2008 | Bachrach et al. | |
| 2008/0208539 A1* | 8/2008 | Lee | E21B 49/00 703/1 |
| 2009/0138247 A1* | 5/2009 | Chow | G05B 17/02 703/2 |
| 2009/0306945 A1 | 12/2009 | Wu et al. | |
| 2011/0098998 A1* | 4/2011 | Lunati | E21B 49/00 703/10 |
| 2013/0035913 A1* | 2/2013 | Mishev | G06F 17/5018 703/2 |
| 2013/0096898 A1* | 4/2013 | Usadi | G01V 1/282 703/10 |
| 2013/0118736 A1* | 5/2013 | Usadi | G06F 17/5018 166/268 |

OTHER PUBLICATIONS

Stephen J. Bourne et al., "Predictive Modelling of Naturally Fractured Reservoirs Using Geomechanics and Flow Simulation", ADIPEC 0911, (2000) $9^{th}$ Abu Dhabi International Petroleum Exhibit and Conference, 10 pgs.

F. Chalon et al., "Upscaling of Elastic Properties for Large Scale Geomechanical Simulations", Int. J. Numer. Anal. Meth. Geomech., 2004, vol. 28, pp. 1105-1119.

Louis J. Durlofsky, "Upscaling of Geocellular Models for Resevoir Flow Simulation: A Review of Recent Progress", Dept. of Petr. Engineering (2003) Presented at $7^{th}$ International Forum on Reservoir Simulation, Germany, 58 pgs.

Y. Efendiev et al., "Multiscale Simulations of Porous Media Flows in Flow-Based Coordinate System", Dept. of Mathematics, Texas A&M University.

Wouter Zijl et al., "Numerical Homogenization of the Riogidity Tensor in Hooke's Law using the Node-Based Finite Element Method", Mathematical Geology, vol. 34, (Apr. 2002) 32 pgs.

Gerard Rijpsma et al., "Upscaling of Hooke's Law for Imperfectly Layered Rocks", Mathematical Geology, vol. 30, (1998) 27 pgs.

International Search Report and Written Opinion, for corresponding PCT Application Serial No. PCT/US2011/058987, 14 pgs.

* cited by examiner

100

METHODS AND SYSTEMS FOR UPSCALING
MECHANICAL PROPERTIES OF
GEOMATERIALS

CROSS-REFERENCE TO RELATED
APPLICATION

This application is the National Stage entry under 35 U.S.C. 371 of PCT/US2011/058987 that published as Intl. Patent Application Publication No. 2012/108917 and was filed on 2 Nov. 2011, which claims the benefit of U.S. Provisional Patent Application No. 61/441,182, filed 9 Feb. 2011, of which is incorporated herein by reference, in its entirety, for all purposes

FIELD OF THE INVENTION

Exemplary embodiments of the present techniques relate to a method and system that provides upscaling of geomechanical properties of geomaterials. More particularly, embodiments of the present techniques relate to methods for upscaling elastic and plastic mechanical properties of geomaterials for use in geomechanical analysis of wellbores, reservoirs, oil fields, and basins.

BACKGROUND

This section is intended to introduce various aspects of the art, which may be associated with exemplary embodiments of the present techniques. This discussion is believed to assist in providing a framework to facilitate a better understanding of particular aspects of the present techniques. Accordingly, it should be understood that this section should be read in this light, and not necessarily as admissions of prior art.

Hydrocarbons are widely used for fuels and chemical feedstocks. Hydrocarbons may be found in subsurface rock formations that are generally termed reservoirs. Removing hydrocarbons from the reservoirs depends on numerous physical properties of the rock formations, such as the permeability of the rock containing the hydrocarbons, the ability of the hydrocarbons to flow through the rock formations, and the proportion of hydrocarbons present, among others. Structural changes in the geological materials affected by reservoir production can have a significant effect on the performance of a wellbore. For example, reservoir compaction can affect pore pressure and rock porosity, resulting in a change in the flow rate of hydrocarbons moving through the rock.

Geomechanical modeling of geological structures provides techniques for analyzing the possible effects of reservoir production on the immediate and surrounding geological structures. Thus, geomechanical modeling can play an important role in analyzing various aspects of hydrocarbon reservoirs. Geomechanical modeling can also be used in forward modeling and restoration modeling of the evolution of geological structures at geologic time scales (i.e. millions of years). Geomechanical modeling can also be used to predict wellbore performance, reservoir compaction, pore pressure, and the like.

The geomechanical model can include the geomechanical properties of subsurface materials, referred herein as "geomaterials." The geomaterials are rarely homogenous, highly variable in their properties, and also contain discontinuities such as fractures. The sources of heterogeneity are environment of deposit (EOD), stratification, diagenetic history, tectonic loading histories, and the like. The scale of heterogeneity is often very small, for example, on the order of a centimeter. Additionally, the mechanical properties of the rocks are scale-dependent. See e.g, Barton, et al., "Engineering Classification of Rock Masses for the Design of Tunnel Support," 6:189-236 ROCK MECHANICS (1974); Hoek & Brown, Underground Excavations in Rock, INSTITUTION OF MINING & METALLURGY, (1980); Suárez-Rivera, et al., "Continuous Rock Strength Measurements on Core and Neural Network Modeling Result in Significant Improvements in Log-Based Rock Strength Predictions Used to Optimize Completion Design and Improve Prediction of Sanding Potential and Wellbore Stability," SPE 84558, SOCIETY OF PETROLEUM ENGINEERS (2003).

Such fine-scale variation of geomechanical properties may be captured in the geological models using rock property algorithms which are developed by integrating data from seismic, well logs, EOD models, lithology, porosity, core tests, and petrophysical characterization. See, U.S. Provisional Patent Application No. 61/226,999, by Crawford, et al. The geological model can also include discontinuities such as fractures. The orientation, spacing, and interfacial properties of discontinuities contribute to the scale dependency of the rock properties.

The mechanical properties of geomaterials may also depend on the drainage conditions of the geomaterials. In an easily drained rock, fluid is able to travel out of the rocks very quickly, which results in little or no excess pore fluid pressure. In a poorly drained rock, fluid is not able to drain out of rocks quickly, resulting in the development of a finite amount of pore pressure within the rock.

To characterize the fine-scale variation of mechanical properties, it would be beneficial to build the geomechanical model at scales close to the geological models. However, simulating such a large scale geomechanical model would involve an enormous amount of computational resources. Even with present-day computational power, geomechanical analyses, especially in three dimensions, cannot be performed at a fine scale. Thus, typical geomechanical analyses are performed at coarse scale. For example, a typical geomechanical model cell-size is about tens to hundreds of meters in the horizontal directions and few meters in the vertical direction. A single geomechanical model cell can be used to represent about 100 to 1000 corresponding geological model cells with varying geomechanical properties. In the numerical methods used for geomechanical analyses, each coarse geomechanical cell is characterized by a single set of mechanical properties. The process of determining a single set of properties for coarse-scale geomechanical cells using the corresponding properties of fine-scale cells in the geological model is often referred to as homogenization or upscaling.

Upscaling in various forms has been used in various branches of engineering. An estimation of upscaled elastic modulus of mixtures is one of the classical problems in the micromechanics. See e.g., Voigt, "Uber die Beziehung zwischen den beiden Elastizitatkonstanten isotroper Korper," 38:573-587 ANNALS OF PHYSICS (1889); Reuss, "Calculation of the Flow Limits of Mixed Crystals on the Basis of Plasticity of Mono-crystals," 9:49-58 ZEITSCHRIFT FUER ANGEWANDTE MATHEMATIK UND MECHANIK (1929).

Upper and lower bounds of elastic modulus of mixtures has been derived on the basis of the variational principles and compared to numerical answers with experimental results. See e.g., Hashin, "The Elastic Moduli of Heterogeneous Materials," 10:143-150 JOURNAL OF APPLIED MECHANICS (1962); Hashin & Shtrikman, "On Some Variational Principles in Anisotropic and Nonhomogeneous Elasticity," 10:

335-342 JOURNAL OF MECHANICS AND PHYSICS OF SOLIDS (1962). These methods are not relevant for reservoir rocks as they may not be idealized as elastic mixtures.

Upscaling methods have been developed for perfectly layered rocks. See Backus, "Long-wave Elastic Anisotropy Produced by Horizontal Layering," 67: 4427-4440 JOURNAL OF GEOPHYSICAL RESEARCH (1962). Additionally, equations have been developed for upscaled properties of a homogeneous transversely isotropic medium of horizontally layered rock. See Salamon, "Elastic Moduli of a Stratified Rock Mass," 5:591-527 JOURNAL OF ROCK MECHANICS AND MINING SCIENCES (1968). Further, these methods have been extended to orthorhombic layers. See Gerrard, "Equivalent Elastic Moduli of a Rock Mass Consisting of Orthorhombic Layers," 19:9-14 JOURNAL OF ROCK MECHANICS AND MINING SCIENCES AND GEOMECHANICS (1982). These methods have been further improved for the case of imperfectly layered rock types. See Rijpsma & Zijl, "Upscaling of Hooke's Law for Imperfectly Layered Rocks," 30:943-969 MATHEMATICAL GEOLOGY (1998). The above publications assume that the rock properties are homogeneous within each layer. Therefore, the methods described in those publications are not suitable for upscaling geomechanical properties of reservoir rocks that exhibit a significant degree of heterogeneity within individual layers. These methods are not suitable for incorporating discontinuities such as fractures and not suitable for study of impact of pore fluid drainage on mechanical properties.

Another Upscaling approach has been developed that uses a node-based finite element method with displacement as the primary variable. Zijl et al., "Numerical Homogenization of the Rigidity Tensor in Hooke's Law Using the Node-Based Finite Element Method," 34:291-322 MATHEMATICAL GEOLOGY (2002). An upscaled elastic rigidity tensor is computed from volume averaged stress and strain such that the equilibrium, elastic law, and energy preserve their scale form on the coarse scale. The method gives an upper bound of the elastic rigidity tensor for a given number of elements. The main limitation of this method is that the discontinuities which make rock properties scale dependent are not considered. A similar method has been developed to for computing the elastic rigidity tensor. Chalon, et al., "Upscaling of Elastic Properties for Large Scale Geomechanical Simulations," 28:1105-1119 INTERNATIONAL JOURNAL FOR NUMERICAL AND ANALYTICAL METHODS IN GEOMECHANICS (2004).

Further, U.K. Patent No. GB2413200 by Mainguy, et al. and U.S. Patent Publication 2005/02346909 by Mainguy, et al. disclose methods of constructing a geomechanical model using methods to upscale elastic properties of rocks. Those methods address upscaling of only elastic properties and do not address upscaling of plastic properties. Furthermore, those methods do not consider the presence of discontinuities, such as fractures, which make rock properties scale dependent. The methods described also do not address deriving rock properties that are influenced by drainage of fluids.

None of the techniques described above provide a generalized method that is suitable for upscaling both elastic and plastic properties of subsurface rocks. Further, none of the techniques described above account for discontinuities or pore fluid drainage.

SUMMARY

Embodiments of the present disclosure provide techniques for upscaling elastic and plastic geomechanical properties. An exemplary embodiment provides a method for upscaling geomechanical properties that includes mapping fine cells from a geological model to a coarse cell and assigning mechanical properties to each of the fine cells based, at least in part, on the geological model. The method also includes simulating material response characteristics of the coarse cell to various boundary conditions based on the mechanical properties assigned to each of the fine cells and computing upscaled mechanical properties of the coarse cell based on the material response characteristics of the coarse cell.

In an embodiment, simulating material response characteristics of the coarse cell includes applying a uniform displacement to a face of the coarse cell and computing a corresponding normal force. Simulating material response characteristics of the coarse cell can also include obtaining a first load/displacement data set by applying a uniform displacement to a face of the coarse cell and computing a corresponding normal force, obtaining a second load/displacement data set by applying the normal force to the face of the coarse cell and computing the corresponding uniform displacement, and obtaining a third load/displacement data set by averaging the first load/displacement data set and the second load/displacement data set.

In an embodiment, simulating material response characteristics of the coarse cell to various boundary conditions can also include computing two or more stress paths, wherein each stress path corresponds to a different initial loading condition. Computing upscaled mechanical properties of the coarse cell can include indentifying a failure point for each stress path and connecting the failure points by a best fit linear line to determining a Mohr-Coulomb surface corresponding to coarse cell.

In an embodiment, computing upscaled mechanical properties of the coarse cell includes computing plastic and elastic mechanical properties of the coarse cell based on the material response characteristics of the coarse cell. Simulating material response characteristics of the coarse cell comprises computing peak failure points of various stress paths, wherein each stress path corresponds to a different initial confining stresses or loading direction. Computing upscaled mechanical properties of the coarse cell comprises identifying a brittle failure surface and a ductile failure surface based on the peak failure points.

In an embodiment, simulating material response characteristics of the coarse cell includes computing incremental plastic strain vectors at a failure point of two or more stress paths. Computing upscaled mechanical properties of the coarse cell can include computing a plastic potential surface based on the incremental plastic strain vectors.

Another embodiment provides a method of modeling fluid flow in a hydrocarbon reservoir. The method may include mapping fine cells from a geological model to a coarse cell and assigning mechanical and hydraulic properties to each of the fine cells based on the geological model. The method may also include simulating material response characteristics of the coarse cell to various boundary conditions based on the mechanical and hydraulic properties assigned to each of the fine cells and computing upscaled elastic and plastic properties of the coarse cell based on the material response characteristics of the coarse cell. The method may also include generating a geomechanical model that includes the coarse cell and generating a fluid flow model based on the geological model. The method may also include simulating the geomechanical model using the upscaled elastic and plastic properties of the coarse cell to determine physical properties that affect the fluid flow model and simulating the fluid flow model based, in part, on the physical properties. In an embodiment, the method also includes determining a pore pressure based on a solution to the simulation of the fluid flow model, and simulating the geomechanical model based, in part, on the pore pressure.

Another embodiment provides a method for producing a hydrocarbon from a hydrocarbon reservoir. The method may include mapping fine cells from a geological model to a coarse cell and assigning mechanical properties to each of the fine cells based on the geological model. The method may also include simulating material response characteristics of the coarse cell to various boundary conditions based on the mechanical properties assigned to each of the fine cells. The method may also include computing upscaled elastic and plastic properties of the coarse cell based on the material response characteristics of the coarse cell. The method may also include generating a geomechanical model that includes the coarse cell and performing a coupled reservoir simulation of the hydrocarbon reservoir using the upscaled elastic and plastic properties obtained for the coarse cell. The method may also include producing a hydrocarbon from the hydrocarbon reservoir based, at least in part, upon the results of the coupled reservoir simulation. In an embodiment, producing the hydrocarbon comprises includes drilling one or more wells to the hydrocarbon reservoir, setting production rates from the hydrocarbon reservoir, or any combinations thereof. The wells can include production wells, injection wells, or both.

Another embodiment provides a system for modelling reservoir properties. The system can include a processor and a storage medium that stores a geological model of a reservoir that includes a matrix of fine cells with associated mechanical properties. The system can also include a non-transitory machine readable medium that includes code configured to direct the operations of a processor. The code may be configured to direct the processor to map a plurality of fine cells from the geological model to a coarse cell and simulate material response characteristics of the coarse cell to various boundary conditions based on the mechanical properties associated with each of the fine cells. The code may also be configured to direct the processor compute upscaled mechanical properties of the coarse cell based on the material response characteristics of the coarse cell and store the upscaled mechanical properties to the storage medium as characteristics of a geomechanical model corresponding to the geological model.

In an embodiment, the code is configured to direct the processor to simulate the material response characteristics of the coarse cell by computing two or more stress paths, wherein each stress path corresponds to a different initial loading condition. The code can also be configured to direct the processor to compute the upscaled mechanical properties of the coarse cell by indentifying a failure point for each stress path and connecting the failure points by a best fit linear line to determining a Mohr-Coulomb surface corresponding to coarse cell.

In an embodiment, code is configured to direct the processor to simulate the material response characteristics of the coarse cell by computing peak failure points of various stress paths, wherein each stress path corresponds to a different initial confining stresses or loading direction. The code can also be configured to direct the processor to compute the upscaled mechanical properties of the coarse cell by identifying a brittle failure surface and a ductile failure surface based on the peak failure points.

In an embodiment, code is configured to direct the processor to simulate the material response characteristics of the coarse cell by computing incremental plastic strain vectors at a failure point of two or more stress paths. The code can also be configured to direct the processor to compute upscaled mechanical properties of the coarse cell by computing a plastic potential surface based on the incremental plastic strain vectors. In an embodiment, the geological model includes a discontinuity which is represented in the coarse cell by a master-slave contact algorithm and simulating the material response characteristics of the coarse cell includes computing a solution to the master-slave contact algorithm.

Another embodiment provides a non-transitory computer-readable medium that includes code configured to direct the operations of a processor. The code may be configured to direct the processor to map a plurality of fine cells from a geological model to a coarse cell, wherein each fine cell in the plurality of fine cells is associated with a mechanical property. The code may also be configured to direct the processor to simulate material response characteristics of the coarse cell to various boundary conditions based on the mechanical property associated with each fine cell. The code may be configured to direct the processor to compute upscaled mechanical properties of the coarse cell based on the material response characteristics of the coarse cell and store the upscaled mechanical properties to the storage medium as characteristics of a geomechanical model corresponding to the geological model.

In an embodiment, the code is configured to direct the processor to receive the various boundary conditions to be applied to one or more faces of the coarse cell and simulate the material response characteristics of the coarse cell by computing load/displacement data of the coarse cell based, at least in part, on the various boundary conditions and the mechanical property associated with each fine cell. The code may also be configured to direct the processor to develop a plasticity model of the coarse cell based, at least in part, on the load/displacement data. The load/displacement data may be used to compute plastic and elastic mechanical properties of the coarse cell. The code may also be configured to direct the processor to compute a plurality of stress paths for the coarse cell and identify a Mohr-Coulomb surface based on the plurality of stress paths.

BRIEF DESCRIPTION OF THE DRAWINGS

The advantages of the present techniques are better understood by referring to the following detailed description and the attached drawings, in which.

DETAILED DESCRIPTION

Figure 1:
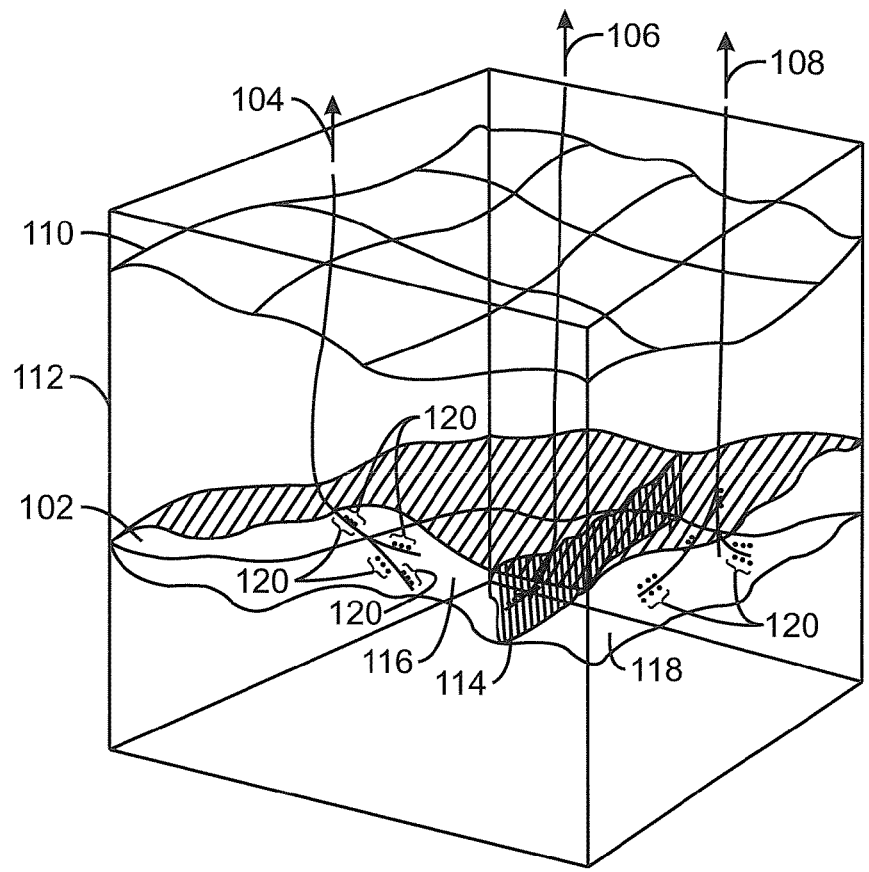
FIG. 1 is a schematic view of a reservoir, in accordance with an embodiment.

In the following detailed description section, the specific embodiments of the present techniques are described in connection with preferred embodiments. However, to the extent that the following description is specific to a particular embodiment or a particular use of the present techniques, this is intended to be for exemplary purposes only and simply provides a description of the exemplary embodiments. Accordingly, the present techniques are not limited to the specific embodiments described below, but rather, such techniques include all alternatives, modifications, and equivalents falling within the true spirit and scope of the appended claims.

At the outset, and for ease of reference, certain terms used in this application and their meanings as used in this context are set forth. To the extent a term used herein is not defined below, it should be given the broadest definition persons in the pertinent art have given that term as reflected in at least one printed publication or issued patent. Further, the present techniques are not limited by the usage of the terms shown below, as all equivalents, synonyms, new developments, and terms or techniques that serve the same or a similar purpose are considered to be within the scope of the present claims.

"Coarsening" refers to reducing the number of cells in simulation models by making the cells larger, for example, representing a larger space in a reservoir. Coarsening is often used to lower the computational costs by decreasing the number of cells in a reservoir model prior to generating or running simulation models.

"Computer-readable medium" or "non-transitory, computer-readable medium," as used herein, refers to any non-transitory storage medium that participates in providing instructions to a processor for execution. Such a medium may include, but is not limited to, non-volatile media and volatile media. Non-volatile media includes, for example, NVRAM, or magnetic or optical disks. Volatile media includes dynamic memory, such as main memory. Common forms of computer-readable media include, for example, a floppy disk, a flexible disk, a hard disk, an array of hard disks, a magnetic tape, or any other magnetic medium, magneto-optical medium, a CD-ROM, a holographic medium, any other optical medium, a RAM, a PROM, and EPROM, a FLASH-EPROM, a solid state medium like a memory card, any other memory chip or cartridge, or any other tangible medium from which a computer can read data or instructions.

As used herein, "to display" or "displaying" includes a direct act that causes displaying of a graphical representation of a physical object, as well as any indirect act that facilitates displaying a graphical representation of a physical object. Indirect acts include providing a website through which a user is enabled to affect a display, hyperlinking to such a website, or cooperating or partnering with an entity who performs such direct or indirect acts. Thus, a first party may operate alone or in cooperation with a third party vendor to enable the information to be generated on a display device. The display device may include any device suitable for displaying the reference image, such as without limitation a virtual reality display, a 3-D display, a CRT monitor, a LCD monitor, a plasma device, a flat panel device, or printer.

"Exemplary" is used exclusively herein to mean "serving as an example, instance, or illustration." Any embodiment described herein as "exemplary" is not to be construed as preferred or advantageous over other embodiments.

"Flow simulation" is defined as a numerical method of simulating the transport of mass (typically fluids, such as oil, water and gas) or energy through a physical system using a simulation model. The physical system may include a three-dimensional reservoir model, fluid properties, and the number and locations of wells. Flow simulations may use or provide a way to evaluate a strategy (often called a well-management strategy) for controlling injection and production rates. These strategies can be used to maintain reservoir pressure by replacing produced fluids with injected fluids (for example, water and/or gas). When a flow simulation correctly recreates a past reservoir performance, it is said to be "history matched," and a higher degree of confidence is placed in its ability to predict the future fluid behavior in the reservoir.

"Permeability" is the capacity of a rock to transmit fluids through the interconnected pore spaces of the rock. Permeability may be measured using Darcy's Law: $Q=(k\Delta P\,A)/(\mu L)$, wherein Q=flow rate ($cm^3/s$), $\Delta P$=pressure drop (atm) across a cylinder having a length L (cm) and a cross-sectional area A ($cm^2$), $\mu$=fluid viscosity (cp), and k=permeability (Darcy). The customary unit of measurement for permeability is the millidarcy. The term "relatively permeable" is defined, with respect to formations or portions thereof, as an average permeability of 10 millidarcy or more (for example, 10 or 100 millidarcy).

"Pore volume" or "porosity" is defined as the ratio of the volume of pore space to the total bulk volume of the material expressed in percent. Porosity is a measure of the reservoir rock's storage capacity for fluids. Porosity is preferably determined from cores, sonic logs, density logs, neutron logs or resistivity logs. Total or absolute porosity includes all the pore spaces, whereas effective porosity includes only the interconnected pores and corresponds to the pore volume available for depletion.

A "reservoir" or "reservoir formation" is defined as a pay zone (for example, hydrocarbon producing zones) that include sandstone, limestone, chalk, coal and some types of shale. Pay zones can vary in thickness from less than one foot (0.3048 m) to hundreds of feet (hundreds of m). The permeability of the reservoir formation provides the potential for production.

"Reservoir properties" and "reservoir property values" are defined as quantities representing physical attributes of rocks containing reservoir fluids. The term "reservoir properties" as used in this application includes both measurable and descriptive attributes. Examples of measurable reservoir property values include porosity, permeability, water saturation, and fracture density. Examples of descriptive reservoir property values include facies, lithology (for example, sandstone or carbonate), and environment-of-deposition (EOD). Reservoir properties may be populated into a reservoir framework to generate a reservoir model.

"Reservoir simulation model" refers to a specific mathematical representation of a real hydrocarbon reservoir, which may be considered to be a particular type of geological model. Reservoir simulation models are used to conduct numerical experiments (reservoir simulations) regarding past performance to verify the properties of reservoirs. Reservoir simulation models are also used to conduct numerical experiments regarding future performance of the field to determine a most profitable operating strategy. An engineer managing a hydrocarbon reservoir may create many different reservoir simulation models, possibly with varying degrees of complexity, in order to quantify the past performance of the reservoir and predict its future performance.

The term "finite element method (FEM)" (sometimes referred to as Finite Element Analysis) is a numerical technique for finding approximate solutions of partial differential equations as well as of integral equations. The solution approach is based either on eliminating the differential equation completely (steady state problems), or rendering the partial differential equation into an approximating system of ordinary differential equations, which are then solved using standard techniques such as Euler's method, or a Runge-Kutta method, among others.

"Transmissibility" refers to the volumetric flow rate between two points at unit viscosity for a given pressure-drop. Transmissibility is a useful measure of connectivity. Transmissibility between any two compartments in a reservoir (fault blocks or geological zones), or between the well and the reservoir (or particular geological zones), or between injectors and producers, can all be useful for characterizing connectivity in the reservoir.

"Well" or "wellbore" includes cased, cased and cemented, or open-hole wellbores, and may be any type of well, including, but not limited to, a producing well, an experimental well, an exploratory well, and the like. Wellbores may be vertical, horizontal, any angle between vertical and horizontal, deviated or non-deviated, and combinations thereof, for example a vertical well with a non-vertical component. Wellbores are typically drilled and then completed by positioning a casing string within the wellbore. Conventionally, a casing string is cemented to the well face by circulating cement into the annulus defined between the outer surface of the casing string and the wellbore face. The casing string, once embedded in cement within the well, is then perforated to allow fluid communication between the inside and outside of the tubulars across intervals of interest. The perforations allow for the flow of treating chemicals (or substances) from the inside of the casing string into the surrounding formations in order to stimulate the production or injection of fluids. Later, the perforations are used to receive the flow of hydrocarbons from the formations so that they may be delivered through the casing string to the surface, or to allow the continued injection of fluids for reservoir management or disposal purposes.

The term "geomaterials" refers to a body of rock or other subsurface solids that is sufficiently distinctive and continuous. Geomaterials can contain one or more fluids, such as water, gas, oil, and kerogen, among others. Note that the terms "geomaterials," "rocks," "sands" and "shales" may be used interchangeably, but will generally be used to denote subsurface rock regions, zones or volumes.

The term "environments of depositions" (EOD) refers to the sum of physical conditions under which portions of a reservoir are formed. A reservoir is often sub-divided into different volumes to distinguish physical conditions that are believed to be present during formation of the reservoir that could lead to differences in reservoir property values (e.g. porosity and permeability). EOD may be derived from seismic data to isolate or divide a reservoir framework into various geological regions, such as channel axes and channel margins.

The rock volume which defines the zone from which hydrocarbons are produced is referred to as "reservoir rock." The material on the lateral sides of reservoir is referred to as "sideburden." The material above and below the reservoir is referred as "overburden" and "underburden" respectively.

Rocks often contain fractures created due to local tension (joints or mode 1 fractures) and due to local shear (faults or mode 2 and 3 fractures). Joints and faults are collectively referred herein as "discontinuities."

The term "undrained" refers to the case where fluids contained within rock pores do not have time to move from one location to another. The term "drained" refers to the case where fluids contained within rock pores have sufficient time to move from one location to another and there is no excess fluid pressure due to a deformation event.

The term "rock property algorithms" collectively refer to the relations between rock mechanical properties, petrophysical properties and geological data. Rock property algorithms are used to populate rock mechanical properties in fine scale geological model.

Overview

Exemplary embodiments of the present invention provide generalized numerical techniques for upscaling a wide variety of geomechanical properties of geomaterials, including elastic and plastic properties. In accordance with embodiments, a fine-scale geological model is used to determine upscaled mechanical properties of a coarse-scale geomechanical model. The geological model can be generated by determining fine-scale rock properties of a sub-surface rock structure. The finer rock property variations in the geological model can be captured using rock property algorithms. The fine-scale geological model can be defined either in a plane view, a two-dimensional cross section, or in three-dimensions. Further, the fine-scale geological model can include pre-existing discontinuities such as fractures.

A specified collection of fine-scale geological model cells corresponding to a single, upscaled coarse cell can be simulated as a boundary value problem. The simulated response of the collection of geological model cells to several perturbations of loading can be used to derive the upscaled mechanical properties of the coarse cell. Suitable boundary conditions can be applied to the collection of fine-scale geological model cells and a load-displacement response of the collection of fine-scale cells can be determined for the arbitrary perturbations of loading using numerical methods. The load-displacement response of the collection of fine-scale geological model cells can be used to simultaneously derive both elastic and plastic properties of the corresponding coarse cell. A wide variety of constitutive models that describe the behavior of intact rock and fractures can be used to derive various mechanical properties of the coarse cell based on the load-displacement response.

In various embodiments, approximate stress paths and strain paths can be computed to determine certain upscaled mechanical properties for the collection of fine-scale cells. Furthermore, the load-displacement response can be simulated for various drainage conditions. In this way, upscaled elastic and plastic properties can be determined based on the effect of discontinuities, fluid drainage, and stress path. Further, upscaled mechanical properties derived in accordance with the techniques described herein account for the magnitude of heterogeneity and its spatial arrangement within the geological model. The upscaling techniques in accordance with embodiments described herein can be used in variety of petroleum industry applications, including coupled reservoir simulations, reservoir compaction, wellbore performance, pore pressure prediction, geomechanical structural forward analysis, and geomechanical structural restoration analysis, among others.

FIG. 1 is a schematic view 100 of a reservoir 102, in accordance with an embodiment. The reservoir 102, such as an oil or natural gas reservoir, can be a subsurface formation that may be accessed by drilling wells 104, 106, and 108 from the surface 110 through layers of overburden 112. The wells 104, 106, and 108 may be deviated, such as being directionally drilled to follow the reservoir 102. Further, the wells can be branched to increase the amount of hydrocarbon that may be drained from the reservoir, as shown for wells 104 and 108. The wells 104, 106, and 108, can have numerous areas with perforations 120 (indicated as dots next to the wells) to allow hydrocarbons to flow from the reservoir 102 into the wells 104, 106, and 108 for removal to the surface. The reservoir 102 may have one or more faults 114 dividing areas, for example regions 116 and 118, which may either restrict or enhance the flow of hydrocarbons.

Figure 2:
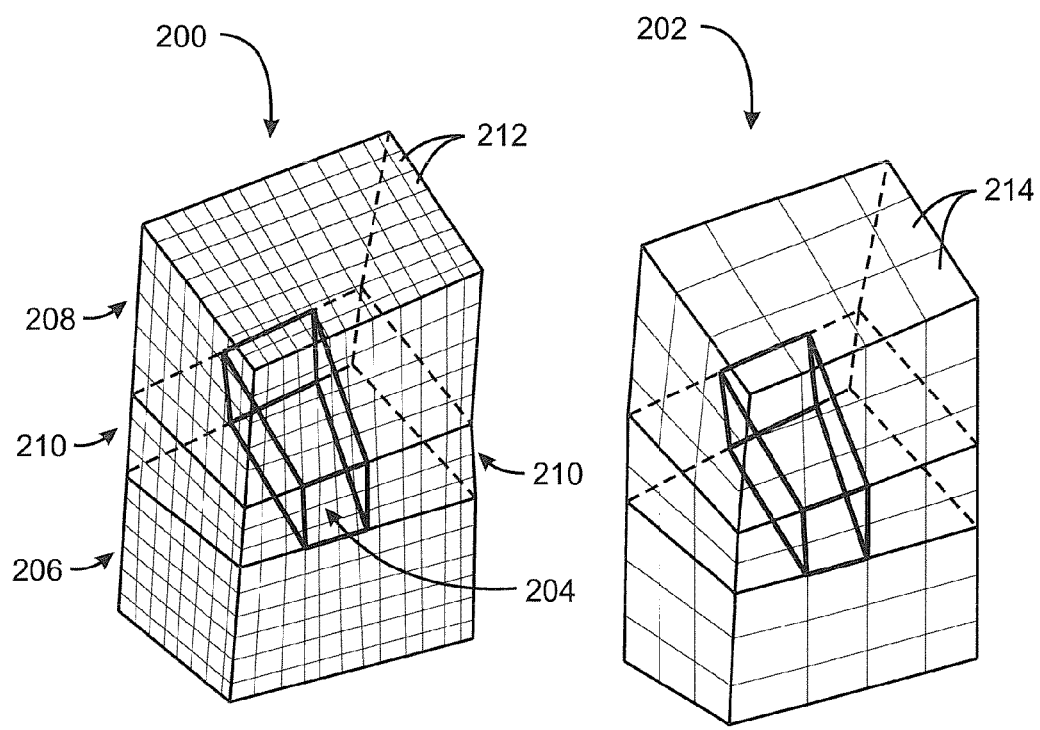
FIG. 2 is a perspective view of a three-dimensional geological model and corresponding upscaled geomechanical model, in accordance with an embodiment.

FIG. 2 is a perspective view of a three-dimensional geological model 200 and corresponding upscaled geomechanical model 202, in accordance with an embodiment. As shown in FIG. 2, the geological model 200 can include a variety of regions, including a reservoir region 204, overburden region 206, underburden region 208, and side burdens 210. The reservoir region can be a hydrocarbon deposit, which may be produced based, at least in part, on the results of fluid flow simulations in accordance with exemplary embodiments. The performance of a wellbore in the reservoir region 204 may depend on characteristics of the hydrocarbon, such as viscosity, and rock characteristics of the reservoir region, such as porosity, permeability, and the like. The wellbore performance may also depend on the rock characteristics of the surrounding geological structures, including the overburden region 206, underburden region 208, and side burden regions 210. For example, the characteristics of the surrounding geological structures can determine the pore pressure within the reservoir region 204. As hydrocarbon is extracted from the reservoir region 204, the reservoir region 204 as well as the surrounding geological structures can deform, leading to changes in pore pressure within the reservoir region 204. Thus, a geomechanical simulation of the geological model 200 can be used to predict the future flow characteristics of a wellbore in the reservoir region.

The geological model can be divided into a fine mesh of geological cells, referred to herein as fine cells 212. The fine cells 212 can be discretized as tetrahedrals or hexahedral elements. Furthermore, although the geological model shown in FIG. 2 is three-dimensional, it will be appreciated that embodiments of the present techniques can include two-dimensional models, which may be discretized as triangles or quadrilaterals, for example. Each fine cell 212 can include a set of mechanical properties that characterize the rock within the fine cell 212. For example, each fine cell 212 can be associated with a corresponding set of elastic and plastic parameters, including Young's Modulus, Poisson's ratio, friction angle, dilation angle, and cohesion, among others. The mechanical properties of the geological model can also include pre-existing discontinuities, such as faults and fractures, which may be represented using cohesive-frictional constitutive relationships. A typical discontinuity includes a stronger surface, referred to as the master and a weaker surface referred to as the slave. The discontinuities may be numerically simulated using master-slave contact algorithms, in which master and slave surfaces stick or slide against each other based on forces acting on them. The mechanical properties of the geological model can be determined, for example, by physical measurements of core samples, seismic data, well logs, EOD models, lithology, and the like.

The number and type of mechanical properties used to describe the geological model can be selected to provide a balance between accuracy of upscaled properties and computational effort. For example, the fine cells 212 can be assumed to be elastic and may be associated with a Young's Modulus and Poisson's ratio. The fine cells 212 can also be assumed to be plastic and may be associated with a Young's Modulus and Poisson's ratio as well as additional mechanical properties, including friction angle, dilation angle, and cohesion, for example. Any suitable combination of mechanical properties may be selected in a particular implementation. Similarly, the discontinuities may be represented by constitutive models of varying complexity.

As described further below in accordance with exemplary embodiments, the fine-scale geological model 200 can be used to generate a coarser-scale geomechanical model 202 which is more suitable for simulation. The geomechanical model can be divided into a coarse mesh of geomechanical cells, referred to herein as coarse cells 214. Each coarse cell 214 corresponds to a plurality of fine cells 212 of the geological model 200. Each coarse cell 214 is associated with one or more upscaled mechanical properties derived from the corresponding set of fine cells 212 of the geological model 200 as described herein in accordance with embodiments. The geomechanical model 202 can then be used to perform a simulation based on the upscaled geomechanical properties. The number of fine cells 212 corresponding to each coarse cell 214 can be specified based on the amount of processing power available to simulate the geomechanical model and the desired degree of accuracy of the simulation results. For example, each coarse cell 214 can represent approximately 100 to 1000 fine cells.

The geomechanical model 202 can be used to perform various types of geological analyses, such as reservoir compaction, wellbore performance, pore pressure prediction, and geomechanical structural forward analysis and geomechanical structural restoration analysis. In embodiments, the geomechanical model 202 is used to perform a coupled reservoir simulation, in which the geomechanical properties are simulated in parallel with a fluid flow simulation. Embodiments of a coupled reservoir simulation are described in relation to FIG. 12.

The strength of cohesive-frictional materials depends, at least in part, on the confining stress within the material. In embodiments, this property is exploited to determine upscaled mechanical properties of generalized elasto-plastic constitutive models corresponding to the coarse cells 214, such as a Mohr-Coulomb plasticity model, or a Cam Clay model, among others. The generalized elasto-plastic models may include brittle and/or ductile failure surfaces, which may be represented as polynomials. Various upscaled elastic and plastic properties of the coarse cells 214 can be extracted from the upscaled elasto-plastic models based, at least in part, on the brittle and/or ductile failure surfaces. Multiple points that define brittle and ductile failure surfaces can be computed by numerical analysis of the fine cells, as described herein. It will be appreciated that the various data plots provided herein are merely for illustration of the present techniques. In an actual implementation, the data represented by the data plots may be generated electronically and stored to an electronic data structure for further processing or future use, for example, in a coarse-scale simulation.

Upscaled Elastic Properties

Figure 3:
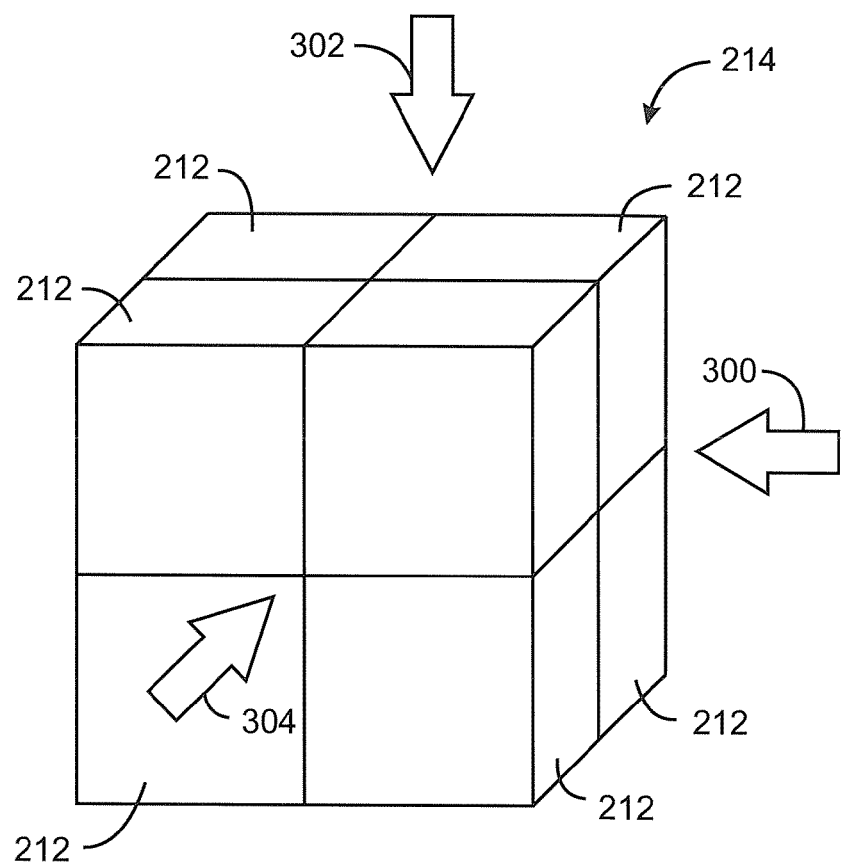
FIG. 3 is a perspective view of a three dimensional coarse cell of the geomechanical model showing the boundary conditions applied to determine upscaled elastic properties of the coarse cell, in accordance with an embodiment.

FIG. 3 is a perspective view of a three dimensional coarse cell 214 of the geomechanical model showing the boundary conditions applied to determine upscaled elastic properties of the coarse cell 214, in accordance with an embodiment. For ease of illustration, the coarse cell 214 shown in FIG. 3 includes eight fine cells 212. However, it will be appreciated that the coarse cell 214 can include any suitable number of fine cells 212, up to several hundreds of fine cells 212. As described above, each fine cell 212 is associated with one or more mechanical properties. Similarly, each fine cell 212 may be associated with set of hydraulic properties, for example, permeability, porosity, fluid viscosity, and the like. The hydraulic properties can be used to specify a drained condition or undrained condition of the fine cell 212. For example, the undrained condition can be specified by specifying a low hydraulic property such as a low permeability. Conversely, the drained condition can be specified by specifying a high permeability. To solve for upscaled elastic properties, each fine cell 212 can be associated with a specified Young's modulus and Poisson's ratio. The upscaled Young's modulus and Poisson's ratio of the coarse cell 214 can be determined by applying various boundary conditions to the coarse cell 214 and computing a load/displacement response of the coarse cell 214 based on the mechanical properties specified for each of the fine cells 212. The load/displacement response can be computed using a variety of numerical methods, for example, finite element method, discrete element method, mesh free methods, and the like. The collective response of the small-scale cells to a number of perturbations of loadings can be used to derive the upscaled mechanical properties of the coarse cell 214.

The present techniques can be used to solve for isotropic and anisotropic elastic properties. Upscaled anisotropic elastic properties may be determined by applying a varying perpendicular force, or load, to three faces of the coarse cell 214, as shown by the arrows 300, 302, 304. For purposes of the present description, the arrow 300 represents the x direction, arrow 302 represents the y direction, and arrow 304 represents the z direction, which is directed into the page. The remaining faces of the coarse cell 214 may be specified as zero displacement boundaries. For purposes of clarity, only the procedure for determining anisotropic elastic properties is described below. However, it will be appreciated that upscaled isotropic elastic properties may be determined by applying a perpendicular load to a single face of the coarse cell 214. Embodiments of the present techniques may be better understood with reference to FIG. 4.

Figure 4:
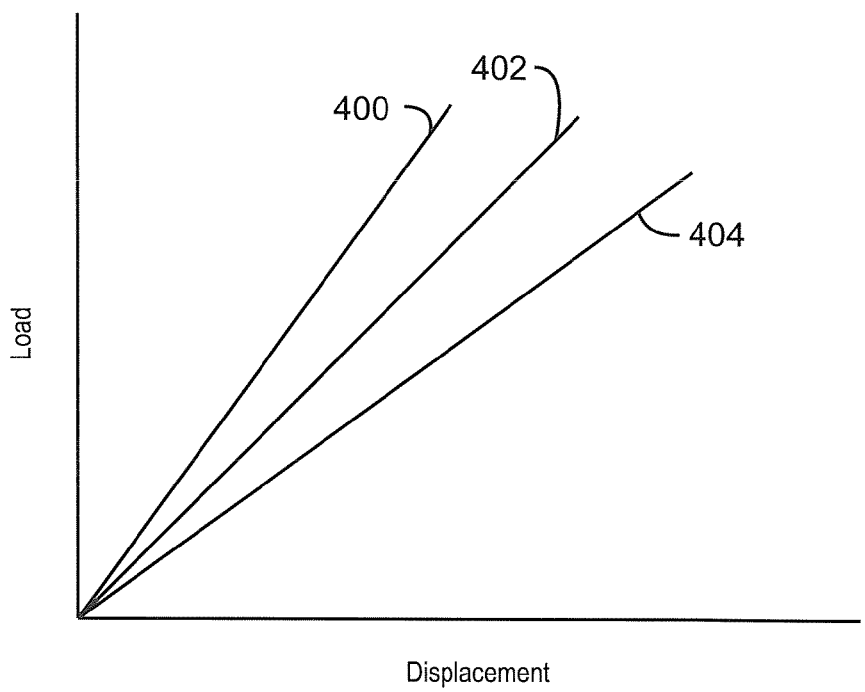
FIG. 4 is an exemplary plot of load/displacement curves computed for the coarse cell described in relation to FIG. 3, in accordance with an embodiment.

FIG. 4 is a plot of load/displacement curves computed for the coarse cell 214 described in relation to FIG. 3, in accordance with an embodiment. Specifically, FIG. 4 shows three load/displacement curves 400, 402, and 404, each curve corresponding to the response computed for one of the three loading directions. The upscaled mechanical properties derived using the techniques described herein are approximate. The resulting upscaled property values will depend, in part, on the type of boundary conditions applied to the coarse cell 214. In an embodiment, the boundary conditions may be uniform displacements. In such cases, each point in the load/displacement curve 400, 402, 404 may be obtained by applying a specific uniform displacement to the face of the coarse cell 214 and computing the corresponding normal force, or load, that would impose such a displacement. In an embodiment, the boundary conditions may be normal forces applied to the faces of the coarse cell 214. In such cases, each point in the load/displacement curve 400, 402, 404 may be obtained by applying a normal force to the face of the coarse cell 214 and computing the corresponding displacement that would result. The application of uniform displacements as the boundary condition provides an upper bound solution, while the application of the normal force as the boundary condition provides a lower bound solution. In embodiments, the load/displacement curves 400, 402, and 404 can be obtained by iteratively applying both types of boundary conditions and averaging the resulting upper bound and lower bound values. Additionally, in embodiments, the load/displacement curves can be calculated for both drained and undrained conditions.

The data represented by the load/displacement curves 400, 402, 404 may be used to compute stress and strain characteristics of the coarse cell 214, which may be used to determine upscaled elastics properties for the coarse cell 214. The normal stress may be computed according to the following formulas:

$$\sigma_x = \frac{F_x}{A_x} \quad \sigma_y = \frac{F_y}{A_y} \quad \sigma_z = \frac{F_z}{A_z} \qquad \text{(Equations 1-3)}$$

In the above formulas, $\sigma_x$, $\sigma_y$, and $\sigma_z$ represent the normal stress in the x, y, and z directions respectively, $F_x$, $F_y$, and $F_z$ represent the load applied in the x, y, and z directions respectively, and $A_x$, $A_y$, and $A_z$ represent the cross-sectional area of the corresponding face over which the load is applied. The normal strain may be computed according to the following formulas:

$$\varepsilon_x = \frac{D_x}{L_x} \quad \varepsilon_y = \frac{D_y}{L_y} \quad \varepsilon_z = \frac{D_z}{L_z} \qquad \text{(Equations 4-6)}$$

In the above formulas, $\varepsilon_x$, $\varepsilon_y$, and $\varepsilon_z$ represent the normal strain in the x, y, and z directions respectively, $D_x$, $D_y$, and $D_z$ represent the displacement in the x, y, and z directions respectively, and $L_x$, $L_y$, and $L_z$ represent the original length of the coarse cell 214 in x, y, and z directions respectively.

The upscaled Poisson's ratio, ν, of the coarse cell 214 is approximately equal to the normal strain as indicated by the following formulas:

$$v_x \approx \epsilon_x, v_y \approx \epsilon_y, v_z \approx \epsilon_z \quad \text{(Equations 7-9)}$$

The upscaled Young's modulus, E, of the coarse cell 214 corresponds to the slope of the load/displacement curve and can be computed by dividing the normal stress by the normal strain according to the following formulas:

$$E_x = \frac{\sigma_x}{\epsilon_x} \quad E_y = \frac{\sigma_y}{\epsilon_y} \quad E_z = \frac{\sigma_z}{\epsilon_z} \quad \text{(Equation 10-12)}$$

Upscaled Elastic and Plastic Properties

Figure 5:
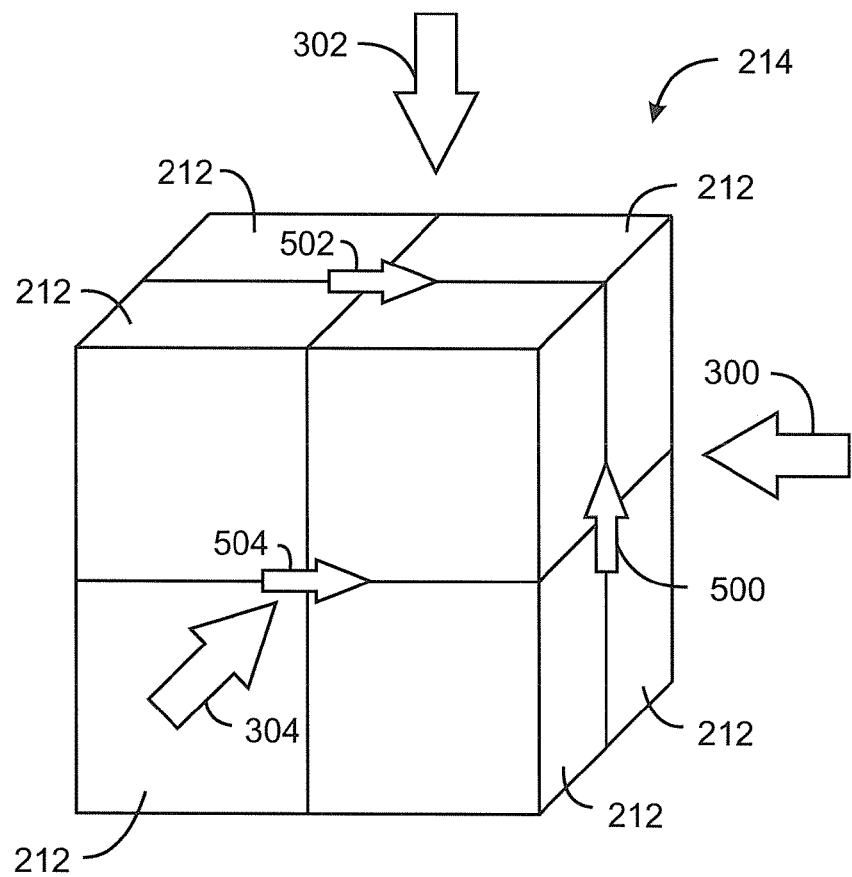
FIG. 5 is a perspective view of a three dimensional coarse cell of the geomechanical model showing the boundary conditions applied to determine upscaled elastic and plastic properties of the coarse cell, in accordance with an embodiment.

FIG. 5 is a perspective view of a three dimensional coarse cell 214 of the geomechanical model showing the boundary conditions applied to determine upscaled elastic and plastic properties of the coarse cell 214, in accordance with an embodiment. As described above, each fine cell 212 is associated with one or more elastic mechanical properties, including Young's modulus and Poisson's ratio. Each fine cell 212 can also include one or more plastic mechanical properties, including friction angle, dilation angle, and cohesion coefficient, among others. The upscaled elastic and plastic properties can be determined by applying various boundary conditions to the coarse cell 214 and computing a shear stress response and normal stress response of the coarse cell 214 based on the mechanical properties specified for each of the fine cells 212, using a numerical method as described above. The collective response of the fine cells 212 to a number of perturbations of normal and shear loadings can be used to derive the upscaled elastic and plastic properties. In embodiments, six load components can be applied to the coarse cell 214. As described above, a normal load can be applied perpendicularly to three faces of the coarse cell 214, as shown by the arrows 300, 302, 304. Additionally, a shear load can be applied tangentially to the three faces of the coarse cell 214, as shown by the arrows 500, 502, and 504. The remaining faces of the coarse cell 214 may be specified as zero displacement boundaries. Embodiments of the present techniques may be better understood with reference to FIG. 6.

Figure 6:
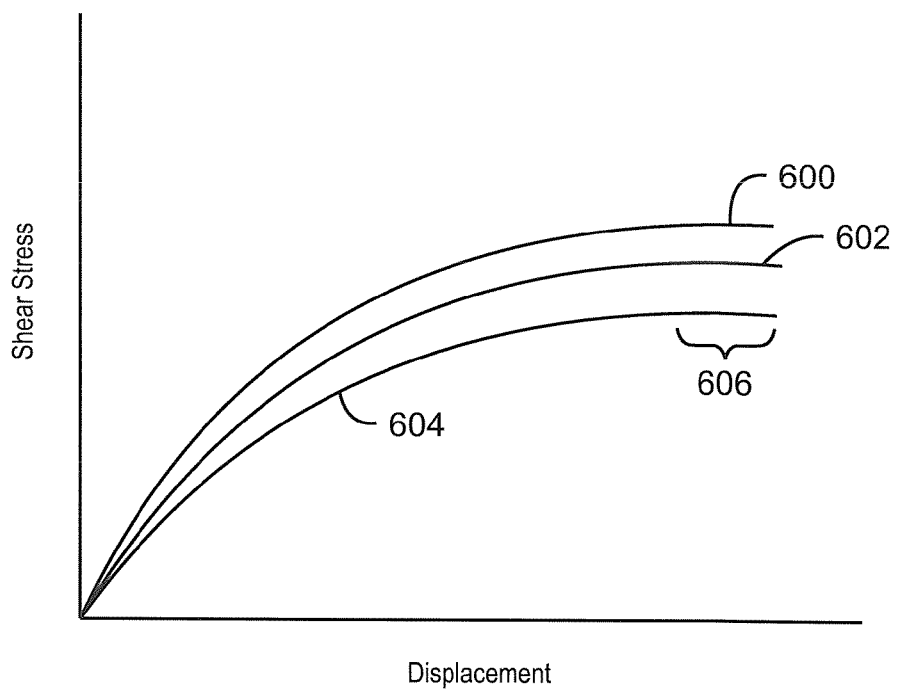
FIG. 6 is a plot of shear stress/displacement curves computed for the coarse cell described in relation to FIG. 5, in accordance with an embodiment.

FIG. 6 is a plot of shear stress/displacement curves computed for the coarse cell 214 described in relation to FIG. 5, in accordance with an embodiment. Specifically, FIG. 6 shows shear stress/displacement curves 600, 602, and 604, each curve corresponding to the response computed for one of the three shear loading directions. As described in relation to FIG. 4, the resulting upscaled property values will depend, in part, on the type of boundary conditions applied to the coarse cell 214. In an embodiment, each point in the shear stress/displacement curves 600, 602, and 604 may be obtained by applying a displacement boundary condition and computing the corresponding shear stress that would impose such a displacement. In an embodiment, each point in the shear stress/displacement curves 600, 602, and 604 may be obtained by applying a shear stress boundary condition and computing the corresponding displacement that would result. In an embodiment, the shear stress/displacement curves 600, 602, and 604 can be obtained by iteratively applying both types of boundary conditions and averaging the resulting upper bound and lower bound values. The applied load or displacement can be uniaxial, biaxial, triaxial, or along any other suitable load or displacement path. Further, the values of load or displacement used as the boundary conditions may be close to the values at which the resulting upscaled properties will be used. The upscaled cohesion of the coarse cell 214 is equal to the displacement-independent shear stress value shown in the region 606 where the curve becomes horizontal.

Additional plastic properties of the coarse cell can be computed by computing stress paths for the coarse cell 214 and computing a corresponding upscaled plasticity model. To compute the stress paths, load/displacement curves may be computed to obtain normal stress values for the coarse cell 214, as described in relation to FIGS. 3 and 4. The normal stress data and shear stress data may be used to compute a plurality of stress paths, which may be used to determine the upscaled plastic properties, as described below in reference to FIG. 7. The load/displacement curves can also be used to obtain the upscaled elastic properties of the coarse cell, as described in relation to FIGS. 3 and 4.

Figure 7:
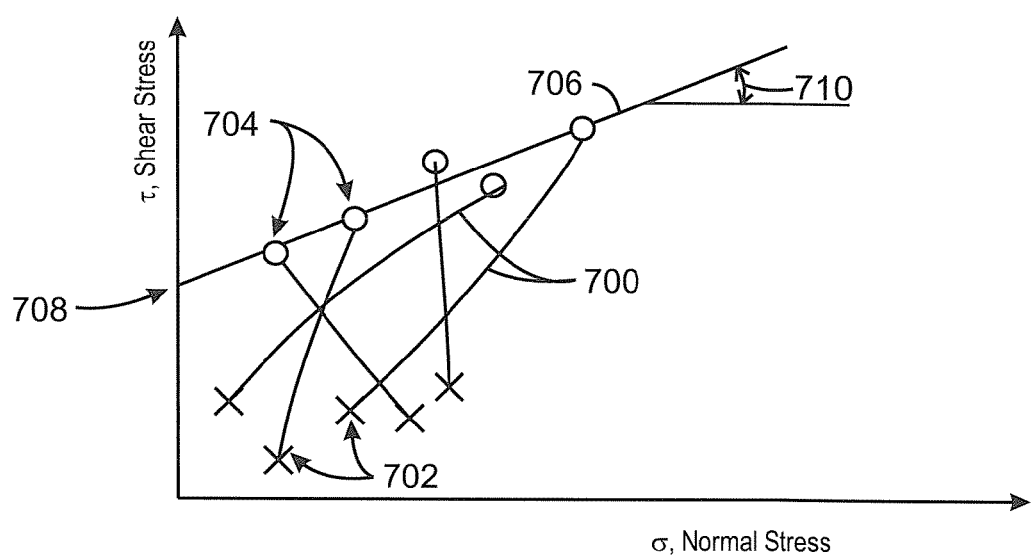
FIG. 7 is a Mohr-Coulomb plasticity model corresponding to the coarse cell, in accordance with an embodiment.

FIG. 7 is a Mohr-Coulomb plasticity model corresponding to the coarse cell 214, in accordance with an embodiment. As shown in FIG. 7, a plurality of stress paths 700 may be computed for the coarse cell 214. Each stress path 700 is a plot of normal stress versus shear stress for various loading conditions. The normal stress values may be obtained from the load/displacement data described in relation to FIG. 4. The shear stress values may be obtained from the shear stress/displacement data described in relation to FIG. 6. Each stress path 700 may be obtained by first applying an initial load value boundary condition to the coarse cell 214. The corresponding normal stress and shear stress for the initial loading value provides the starting point 702 for the corresponding stress path. The loading value applied to the coarse cell 214 may be incremented and the resulting shear stresses and normal stresses may be used to plot the full stress path 700. A different stress path 702 may be computed by starting with a different initial loading condition. Although FIG. 7 shows five stress paths, it will be appreciated that any suitable number of stress paths 700 may be computed, for example, two to twenty or more.

Each stress path 700 may terminate at a failure point 704. Each failure point can be identified by a sudden decrease in load carrying capacity of the rock volume as indicated in the numerical simulations. The failure points 704 of two or more stress paths 700 can be used to determine a property of the coarse cell 214 known as the Mohr-Coulomb surface 706. The upscaled Mohr-Coulomb surface 706 of the coarse cell 214 can be determined by determining the best fitting linear line that connects the failure points 704, for example, using a total least squares method. The upscaled Mohr-Coulomb surface can be used to determine upscaled plastic properties of the coarse cell 214, including friction angle, cohesion, and dilation angle. The upscaled cohesion of the coarse cell 214 equals the shear stress at the point 708 where the Mohr-Coulomb surface 706 intersects the shear stress axis. The upscaled friction angle 710 of the coarse cell 214 equals the angle of the Mohr-Coulomb surface 706 from horizontal, in other words, the slope of the Mohr-Coulomb surface 706. The technique for obtaining the upscaled dilation angle of the coarse cell 214 is described in relation to FIG. 8.

Figure 8:
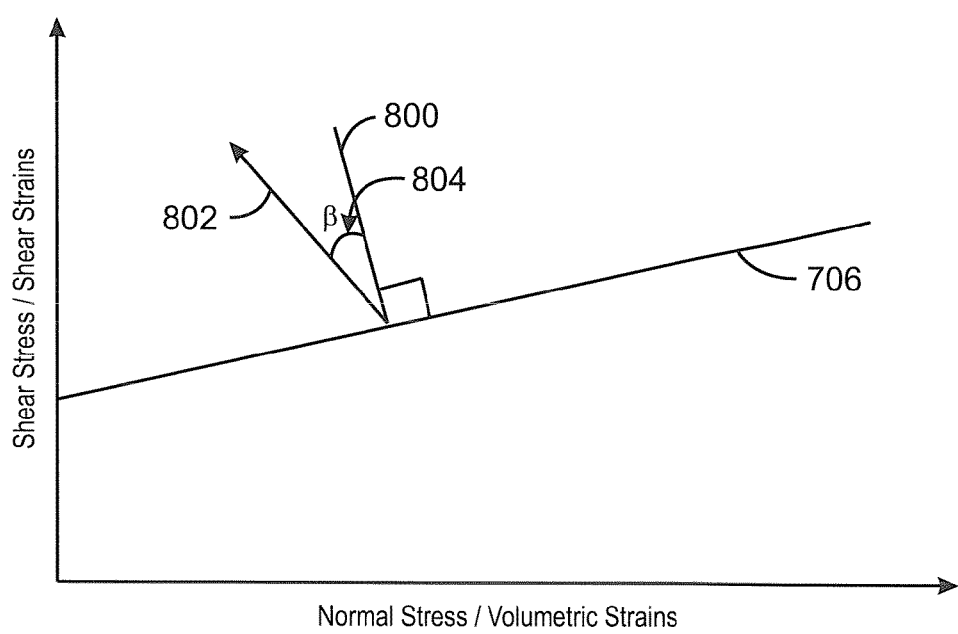
FIG. 8 is a Mohr-Coulomb plasticity model with associated plastic strains corresponding to the coarse cell, in accordance with an embodiment.

FIG. 8 is a Mohr-Coulomb plasticity model with associated plastic strains corresponding to the coarse cell 214, in accordance with an embodiment. The Mohr-Coulomb surface 706 may be computed as described in relation to FIG. 7 and used to determine the upscaled dilation angle, β, of the coarse cell 214 (FIG. 5). The dilation angle expresses the ratio between increments of plastic volumetric strain and shear strain. The angle of dilation controls the amount of plastic strains developed during plastic shearing. The dilation angle, β, equals the angle between the strain increment vector and the mean stress axis and can be computed using following equation:

$$\tan\beta = \frac{\text{increments\_of\_plastic\_volumetric\_strain}}{\text{increments\_of\_shear\_strain}} \quad \text{(Equation 13)}$$

As shown in FIG. 8, the upscaled dilation angle, β, of the coarse cell 214 equals the angle between a line 800 perpendicular to the Mohr-Coulomb surface 706 and an incremental plastic strain vector 802. The incremental plastic strain vector 802 may be computed as part of the finite element solution. For every increment of load, the finite element solution gives an increment of strain.

Figure 9:
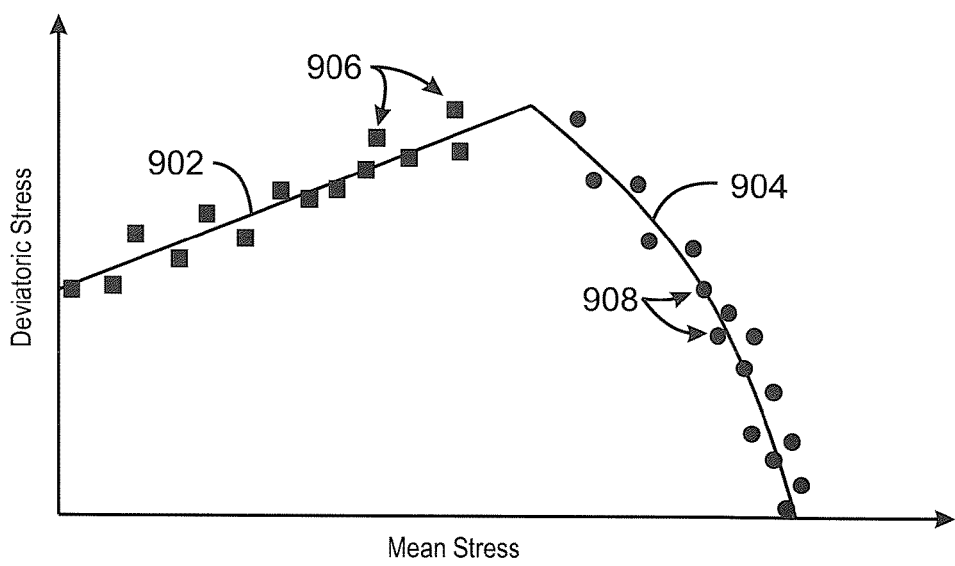
FIG. 9 is a diagram that shows upscaled brittle and ductile failure surfaces of the coarse cell, in accordance with an embodiment.

FIG. 9 is a diagram that shows upscaled brittle and ductile failure surfaces of the coarse cell 214, in accordance with an embodiment. The brittle failure surface 902 and ductile failure surface 904 can be determined by computing failure points 906 and 908 of various stress paths, wherein each stress path corresponds to a different initial confining stresses or loading direction. Each failure point 906 and 908 corresponds to specific values of deviatoric stress and mean stress at failure. The stress paths corresponding to each failure point 906 and 908 can be computed for different combinations of loads/displacement using a numerical analysis such as a finite element method. A best fit line through failure points 906 gives upscaled brittle surface and a similar line through failure points 908 gives upscaled ductile surface, thus computing the entire spectrum of failure surfaces. The upscaled failure surfaces may be used as constitutive models of coarse scale geomechanical cells. The confining stress and stress at failure may be used to compute the mean stress, p, and the deviatoric stress, q, for a given stress path. The mean stress, p, can be computed as the average of the three direct stresses, as shown in the following equation:

$$p = (sig_x + sig_y + sig_z)/3 \quad \text{(Equation 14)}$$

The deviatoric stress, q, is a function of the individual stress components and indicates the extent to which the stress components differ. The deviatoric stress, q, can be computed using following equation:

$$q = \sqrt{(sig_x - sig_y)^2 + (sig_y - sig_z)^2 + (sig_z - sig_x)^2 + 3(txy^2 + tzx^2 + txy^2)} \quad \text{(Equation 15)}$$

In the above equations, $sig_x$ represents stress in x-direction, $sig_y$ represents stress in y-direction, and $sig_z$ represents stress in z-direction. Additionally, txy represents shear stress in xy plane, tyz represents shear stress in yz plane, and tzx represents shear stress in zx plane.

Figure 10:
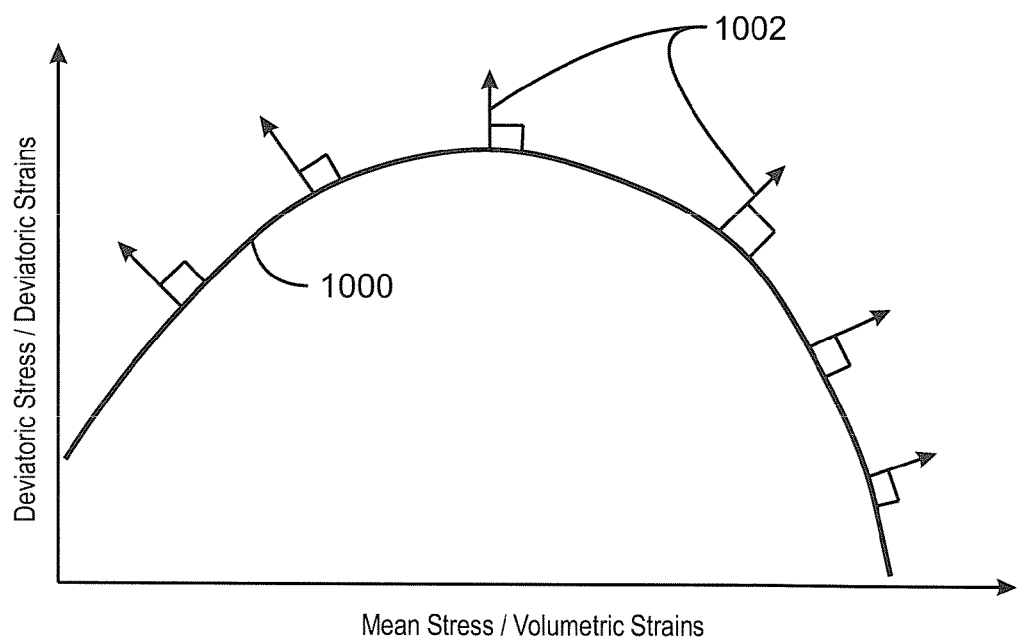
FIG. 10 is a diagram that shows a plastic potential surface 1000, in accordance with an embodiment.

FIG. 10 is a diagram that shows a plastic potential surface 1000, in accordance with an embodiment. The plastic potential surface 1000 can be obtained by computing the incremental plastic strain vectors 1002 at the failure point of several stress paths. The deviatoric incremental strain and volumetric incremental plastic strains at each failure point can be obtained from the finite element solution. The incremental plastic strain vectors 1002 may be obtained from the numerical solution results similar to FIG. 8. A surface drawn perpendicular to the plastic strain vectors gives the upscaled plastic potential surface 1000. The upscaled plastic potential may be used as part of the constitutive relation for the coarse scale geomechanical cell.

Figure 11:
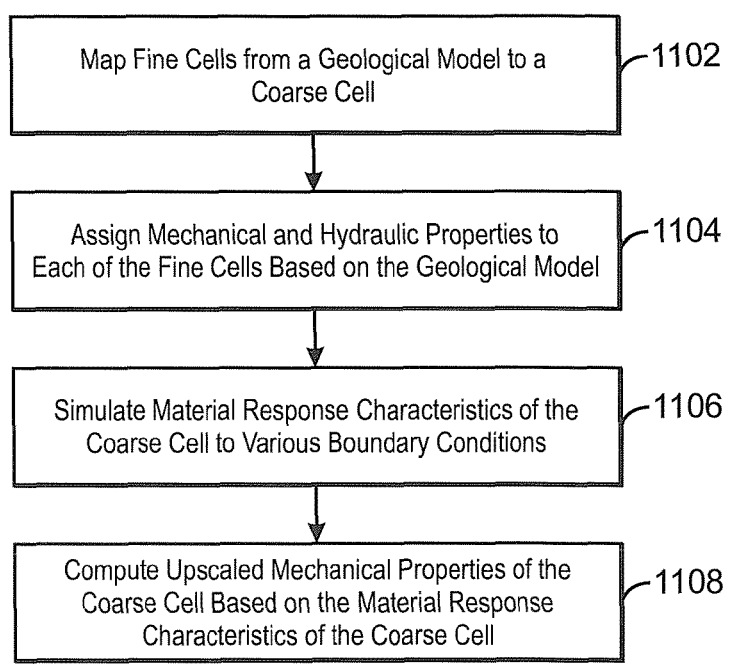
FIG. 11 is a process flow diagram summarizing a method for determining upscaled elastic and plastic properties of a geomechanical cell, in accordance with an embodiment.

FIG. 11 is a process flow diagram summarizing a method for determining upscaled elastic and plastic properties of a geomechanical cell, in accordance with an embodiment. The method is referred to by the reference number 1100 and may begin at block 1102. At block 1102, fine cells from a fine-scale geological model may be mapped to a corresponding coarse cell of a coarse-scale geomechanical model.

At block 1104, mechanical and hydraulic properties may be assigned to each of the fine cells based on the properties of the geological model. As described above in relation to FIG. 2, each of the fine cells can be associated with a Young's Modulus and Poisson's ratio as well as additional mechanical properties, including friction angle, dilation angle, cohesion, and permeability for example. Any suitable combination of mechanical properties may be selected in a particular implementation. Further, discontinuities, such as faults and fractures, may be represented using constitutive relationships such as master-slave contact algorithms. The mechanical properties of the geological model can be determined, for example, by physical measurements of core samples, seismic data, well logs, environment of deposition (EOD) models, lithology, and the like.

At block 1106, the material response of the coarse cell to various boundary loading conditions may be simulated using the material properties of each of the fine cells included in the coarse cell. For example, a load/displacement response of the coarse cell can be computed based on the mechanical properties specified for each of the fine cells as described above in relation to FIG. 4. Additionally, if plastic properties are to be obtained shear stress/displacement data may be computed as described above in relation to FIG. 6. The load/displacement response and the shear stress/displacements data can be computed using a variety of numerical methods, for example, finite element method, discrete element method, mesh free methods, and the like. Further, the effect of any discontinuities represented in the coarse cell may be simulated using the constitutive relationships used to characterize the discontinuity, such as the master-slave contact algorithm.

At block 1108, upscaled mechanical properties of the coarse cell may be calculated based on the material response characteristics computed at block 1106. The upscaled mechanical properties can include any combination of elastic or plastic properties that may be desired for a particular application. For upscaled elastic properties, the load/displacement curves may be used to compute stress and strain characteristics of the coarse cell. The stress and strain characteristics may be used to determine upscaled elastic properties for the coarse cell, as described above in relation to FIG. 4.

Upscaled plastic properties of the coarse cell may also be calculated based on the material response characteristics computed at block 1106. For example, upscaled cohesion of the coarse cell may be equal to the displacement-independent shear stress value, as shown in FIG. 6. Furthermore, additional plastic properties may be obtained by using normal stress data and shear stress data to compute a plurality of stress paths. The stress paths may be used to generate a Mohr-Coulomb plasticity model from which various upscaled plastic properties of the coarse cell may be derived, as described in relation to FIGS. 7 and 8. Furthermore, deviatoric stress and strain data can be calculated and used to determine additional upscaled mechanical properties. For example, upscaled brittle and ductile failure surfaces of the coarse cell can be computed as described in relation to FIG. 9. A plastic potential surface of the coarse cell can be computed as described in relation to FIG. 10. The resulting upscaled geomechanical properties may be stored in a data structure on a tangible, machine readable medium and used in various types of geomechanical modeling applications, including coupled reservoir simulations, reservoir compaction, wellbore performance, pore pressure prediction, geomechanical structural forward analysis, and geomechanical structural restoration analysis, among others.

The techniques for determining upscaled elastic and plastic properties of a geomechanical model, described herein, have many advantages. For example, the techniques take into account the spatial arrangement of material property distribution. Additionally, both elastic and inelastic properties may be obtained separately or at the same time. Furthermore, analyses can be performed in two or three dimensions, discontinuities such as fractures may be incorporated in the boundary value problem, and undrained or drained response of the material can be obtained.

Workflow for Modelling a Reservoir

Figure 12:
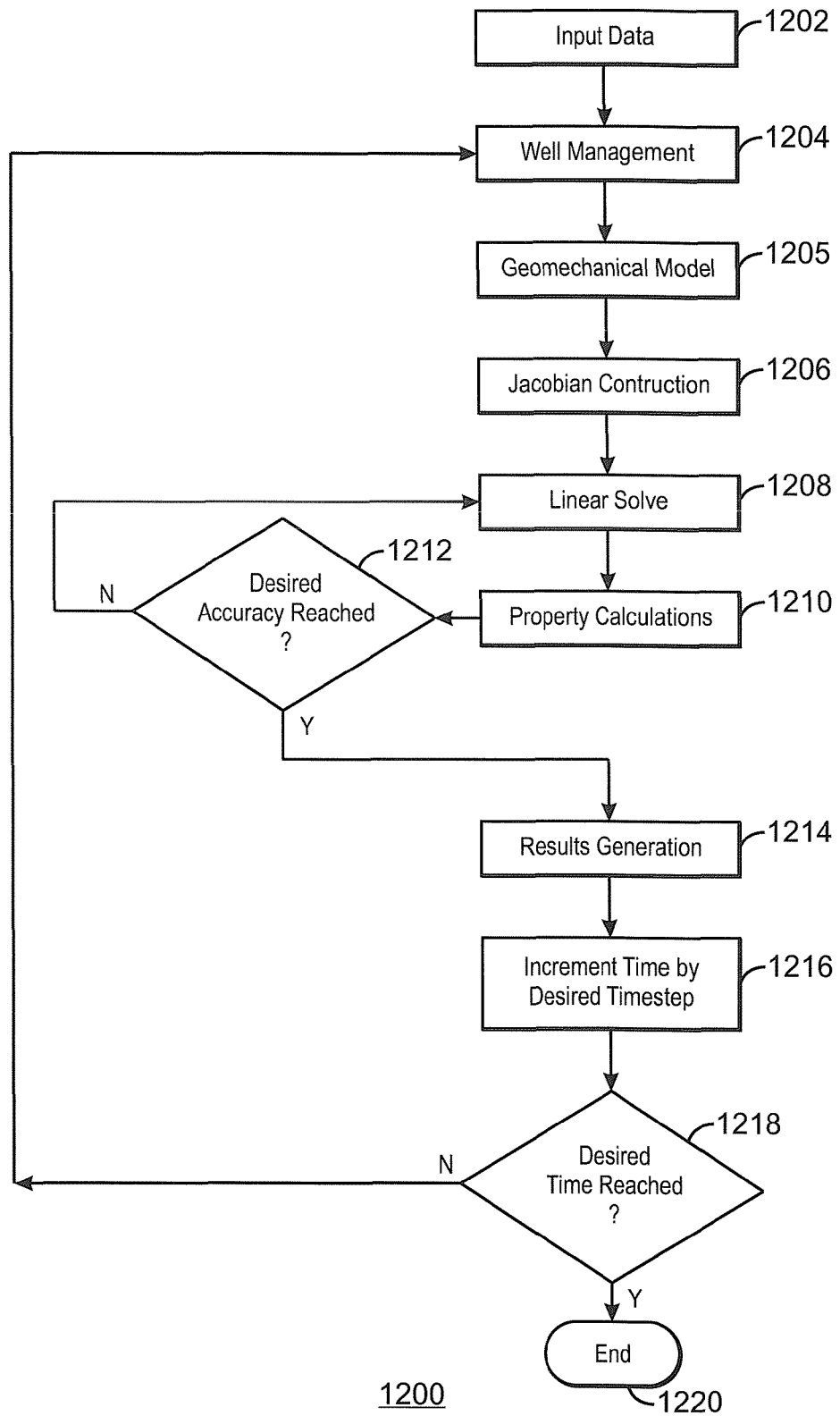
FIG. 12 is a process flow diagram of a workflow for modeling a reservoir using a coupled reservoir simulation, in accordance with an embodiment.

FIG. 12 is a process flow diagram of a workflow 1200 for modeling a reservoir using a coupled reservoir simulation, in accordance with an embodiment. Although the coarsening and the level of implicitness (which state variables, such as pressure or saturation, are treated implicitly or explicitly in the formulation) of the solution process varies, simulation models may perform in a similar fashion as workflow 1200. A simulation model can begin at block 1202 by parsing user input data to generate a reservoir model that includes a fluid flow model and a geomechanical model. The fluid flow model can be a geological model that is discretized into grid blocks with physical properties defined at each grid block, including rock properties (such as permeability) and fluid properties (such as transmissibility). The geomechanical model can be discretized into the coarse cells with upscaled elastic and plastic properties computed as described above. At block 1204, a well management routine computes the current state of surface facilities and wells from the governing equations. At block 1205, the geomechanical model can be simulated to determine physical properties that will have an effect on the fluid flow model, such as rock porosity, number of voids, volume of porosity, and compressibility, among others. At block 1206, the values from the well management routine and the geomechanical model simulation are used along with the value of state variables at each computational cell to construct a Jacobian matrix. The Jacobian matrix is the matrix (or array) of all first order partial derivatives (with respect to the state variables) of a vector valued function. In the fluid flow simulation, the Jacobian details the change of the governing partial differential equations with respect to the state variables (pressure, saturation).

At block 1208, the linear solver uses the Jacobian matrix to generate updates for physical properties of interest, such as pressure and saturation, among others. At block 1210, the calculated physical properties are compared to either previously calculated properties or to measured properties. At block 1212, a determination is made as to whether a desired accuracy has been reached. In an exemplary embodiment, the determination is made by determining that the calculated properties have not significantly changed since the last iteration (which may indicate convergence). For example, convergence may be indicated if the currently calculated properties are within 0.01%, 0.1%, 1%, 10%, or more of the previously calculated properties. In other embodiments, the determination may be determining if the calculated properties are sufficiently close to measured properties, for example, within 0.01%, 0.1%, 1%, 10%, or more. If the desired accuracy is not reached, process flow returns to block 1208 to perform another iteration of the linear solver.

If at block 1212, the desired accuracy has been reached, process flow proceeds to block 1214, at which results are generated. The results may be stored in a data structure on a tangible, machine readable medium, such as a database, for later presentation, or the results may be immediately displayed or printed after generation. Furthermore, the pore pressure may be passed to the geomechanical model and used at block 405 during the next iteration of the geomechanical simulation. At block 1216, the time is incremented by a desired time step, for example, a day, a week, a month, a year, 5 years, 10 years or more, depending, at least in part, on the desired length of time for the simulation. At block 1218, the new time is compared to the length desired for the simulation. If the simulation has reached the desired length of time, the simulation ends at block 1220. If the time has not reached the desired length, flow returns to block 1204 to continue with the next increment.

Exemplary Cluster Computing System

Figure 13:
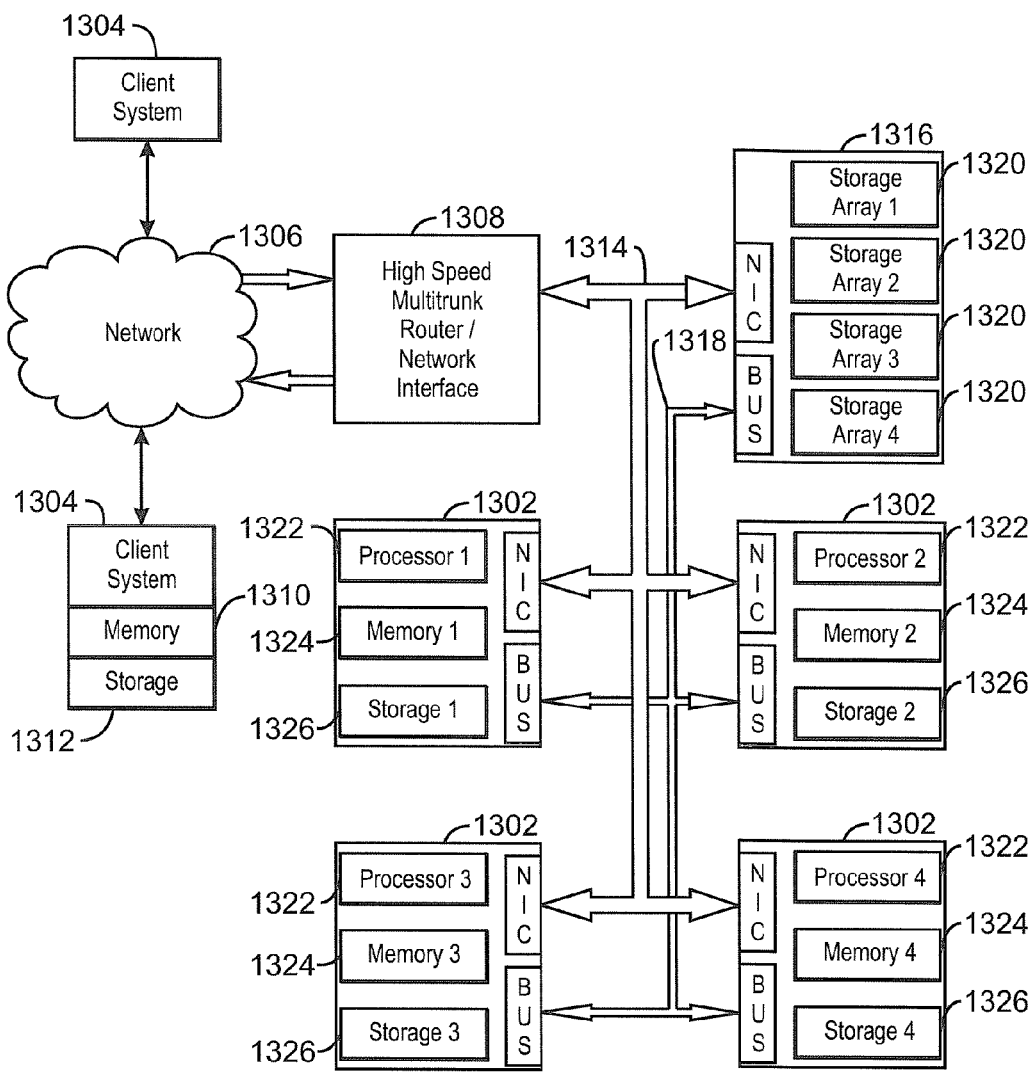
FIG. 13 is a block diagram of an exemplary cluster computing system that may be used in an embodiment.

FIG. 13 is a block diagram of an exemplary cluster computing system 1300 that may be used in an embodiment. The cluster computing system 1300 illustrated has four computing units 1302, each of which may perform calculations for part of a simulation model. However, one of ordinary skill in the art will recognize that the present techniques are not limited to this configuration, as any number of computing configurations may be selected. For example, a small simulation model may be run on a single computing unit 1302, such as a workstation, while a large simulation model may be run on a cluster computing system 1300 having 10, 100, 1000, or even more computing units 1302.

The cluster computing system 1300 may be accessed from one or more client systems 1304 over a network 1306, for example, through a high speed network interface 1308. The network 1306 may include a local area network (LAN), a wide area network (WAN), the Internet, or any combinations thereof. Each of the client systems 1304 may have non-transitory, computer readable memory 1310 for the storage of operating code and programs, including random access memory (RAM) and read only memory (ROM). The operating code and programs may include the code used to implement all or any portions of the methods discussed herein. Further, the non-transitory computer readable media may hold a data representation of a physical hydrocarbon reservoir, for example, a geological model as shown in FIG. 2. The client systems 1304 can also have other non-transitory, computer readable media, such as storage systems 1312. The storage systems 1312 may include one or more hard drives, one or more optical drives, one or more flash drives, any combinations of these units, or any other suitable storage device. The storage systems 1312 may be used for the storage of code, models, data, and other information used for implementing the methods described herein. For example, the data storage system may hold a plurality of upscaled geomechanical properties that have been computed for coarse cells of the geomechanical model to be used in a reservoir simulation.

The high speed network interface 1308 may be coupled to one or more busses in the cluster computing system 1300, such as a communications bus 1314. The communication bus 1314 may be used to communicate instructions and data from the high speed network interface 1308 to a cluster storage system 1316 and to each of the computing units 1302 in the cluster computing system 1300. The communications bus 1314 may also be used for communications among computing units 1302 and the storage array 1316. In addition to the communications bus 1314 a high speed bus 1318 can be present to increase the communications rate between the computing units 1302 and/or the cluster storage system 1316.

The cluster storage system 1316 can have one or more non-transitory, computer-readable media devices, such as storage arrays 1320 for the storage of data, visual representations, results, code, or other information, for example, concerning the implementation of and results from the methods of FIGS. 11 and 12. The storage arrays 1320 may include any combinations of hard drives, optical drives, flash drives, holographic storage arrays, or any other suitable devices.

Each of the computing units 1302 can have a processor 1322 and associated local non-transitory, computer-readable media, such as memory 1324 and storage 1326. The processor 1322 may include a single processing core, multiple processing cores, a GPU, or any combinations thereof. The memory 1324 may include ROM and/or RAM used to store code that directs the processor 1322 to generate upscaled geomechanical properties or implement the coupled reservoir simulation illustrated in FIG. 12, for example. The storage 1326 may include one or more hard drives, one or more optical drives, one or more flash drives, or any combinations thereof. The storage 1326 may be used to provide storage for intermediate results, data, images, or code associated with operations, including code used to implement the methods described herein.

The present techniques are not limited to the architecture or unit configuration illustrated in FIG. 13. For example, any suitable processor-based device may be utilized for implementing all or a portion of embodiments of the present techniques, including without limitation personal computers, networks personal computers, laptop computers, computer workstations, GPUs, mobile devices, and multi-processor servers or workstations with (or without) shared memory. Moreover, embodiments may be implemented on application specific integrated circuits (ASICs) or very large scale integrated (VLSI) circuits. In fact, persons of ordinary skill in the art may utilize any number of suitable structures capable of executing logical operations according to the embodiments.

Experimental Results

Figure 14:
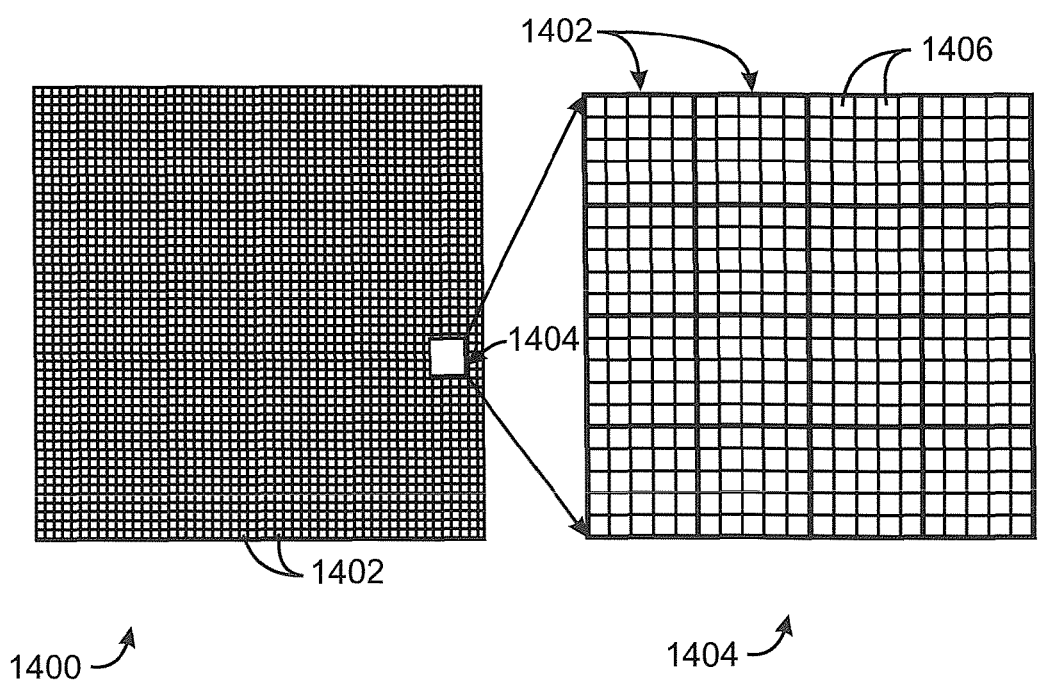
FIG. 14 is a diagram showing an example of a two-dimensional a geological model grid used to develop the experimental results described herein.

FIG. 14 is a diagram showing an example of a two-dimensional a geological model grid 1400 used to develop the experimental results described herein. In this example, a group of 16 fine cells 1402 in a geological model 1400 were used to define a single coarse cell 1404 in a geomechanical model. Each fine cell 1402 within the coarse cell 1404 was further divided into a mesh of 25 computational cells 1406 to generate the finite element mesh, which was simulated to obtain the upscaled mechanical properties of the coarse cell 1404. In this example, the dimensions of each fine cell 1402 are one meter by one meter.

Experimental Results—Upscaling of Elastic Properties

For the upscaling of elastic properties, the finite element model shown in FIG. 14 was subjected to zero displacement on two sides and 0.125 meter displacement was applied to the vertical face in one case and to the horizontal face in another case. It was assumed that the Young's modulus of 16 geological model cells were 10 MPa to 160 MPa in the increments of 10 MPa. The Poisson's ratio was kept constant at 0.3. The results of this analysis are shown in FIG. 15.

Figure 15:
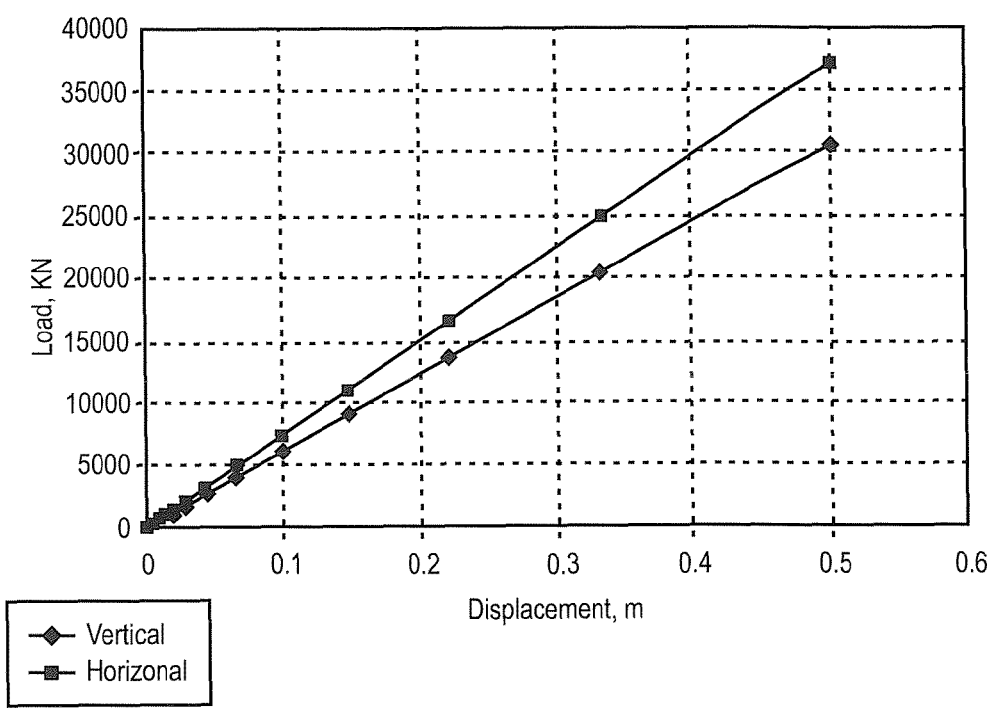
FIG. 15 is a graph that shows load/displacement curves computed for the coarse cell.

FIG. 15 is a graph that shows load/displacement curves computed for the coarse cell 1404 (FIG. 14). Specifically, the graph of FIG. 15 shows load/displacement curves computed for the horizontal and vertical cases described above. The slope of each curve is a function of the upscaled Young's modulus. The average stress in the vertical case was 7625 kPa and the average strain was 0.125. The Young's modulus in the vertical direction was about 61 MPa. Similarly, the Young's modulus in horizontal direction was about 76 MPa.

Additionally, to investigate the influence of spatial distribution of rock types, analyses were carried out on various arrangements of the fine cells 1402 using the same material properties for each fine cell 1402. The 16 fine cells 1402 can be arranged in $2.09 \times 10^{13}$ (16 factorial) different ways. Here some of the random arrangements were analyzed using FEM. In these arrangements, each fine cell 1402 was assigned the same mechanical properties irrespective of the fine cell's spatial position. The results of this analysis are shown in FIG. 16.

Figure 16:
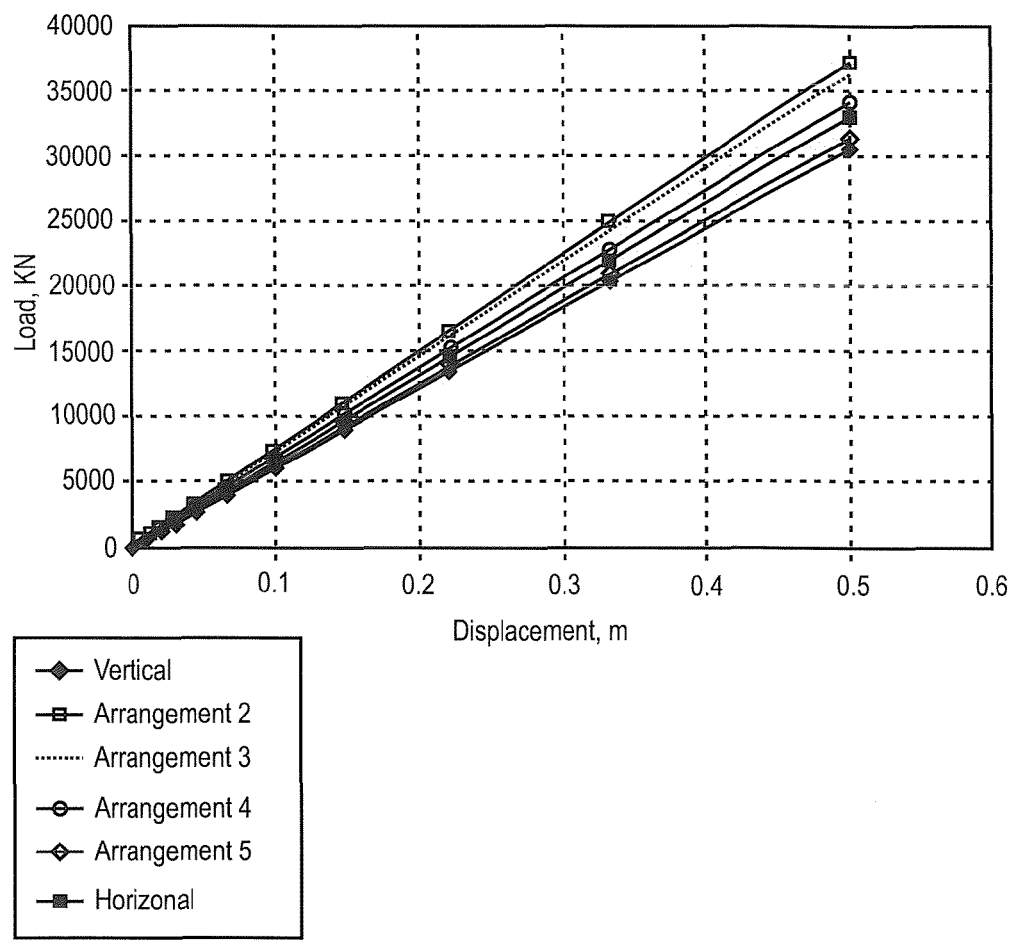
FIG. 16 is a graph that shows load/displacement curves computed for the coarse cell using different spatial arrangements of the fine cells.

FIG. 16 is a graph that shows load/displacement curves computed for the coarse cell 1404 (FIG. 14) using different spatial arrangements of the fine cells 1402. The results shown in FIG. 16 clearly demonstrate the influence of spatial arrangement. In other words, not only the numerical values of elastic properties but also their spatial position influences upscaled elastic properties.

Experimental Results—Upscaling of Cohesion

For the upscaling of cohesion, the fine cells 1402 of the finite element mesh were assigned constant elastic properties and the friction angle was set to zero. Sixteen cohesion values (100 to 1600 kPa, in 100 kPa increments) were randomly assigned to the 16 fine cells 1402. Upscaled cohesion value is independent of confining stress, but it may depend on spatial arrangement of geological model cells. Several analyses were carried out by arranging the blocks in different arrangements. The value of cohesion for each fine cell 1402 was the same irrespective of the fine cell's spatial position. Thus, the only variable in each of the different models was the spatial arrangement of blocks.

Two adjacent sides of the coarse cell 1404 were supported in normal directions and displacement was applied to the other two sides (one side at a time). Several analyses were carried out by applying displacement in both horizontal and vertical directions. The applied load was converted to upscaled cohesion. The results of this analysis are shown in FIG. 17.

Figure 17:
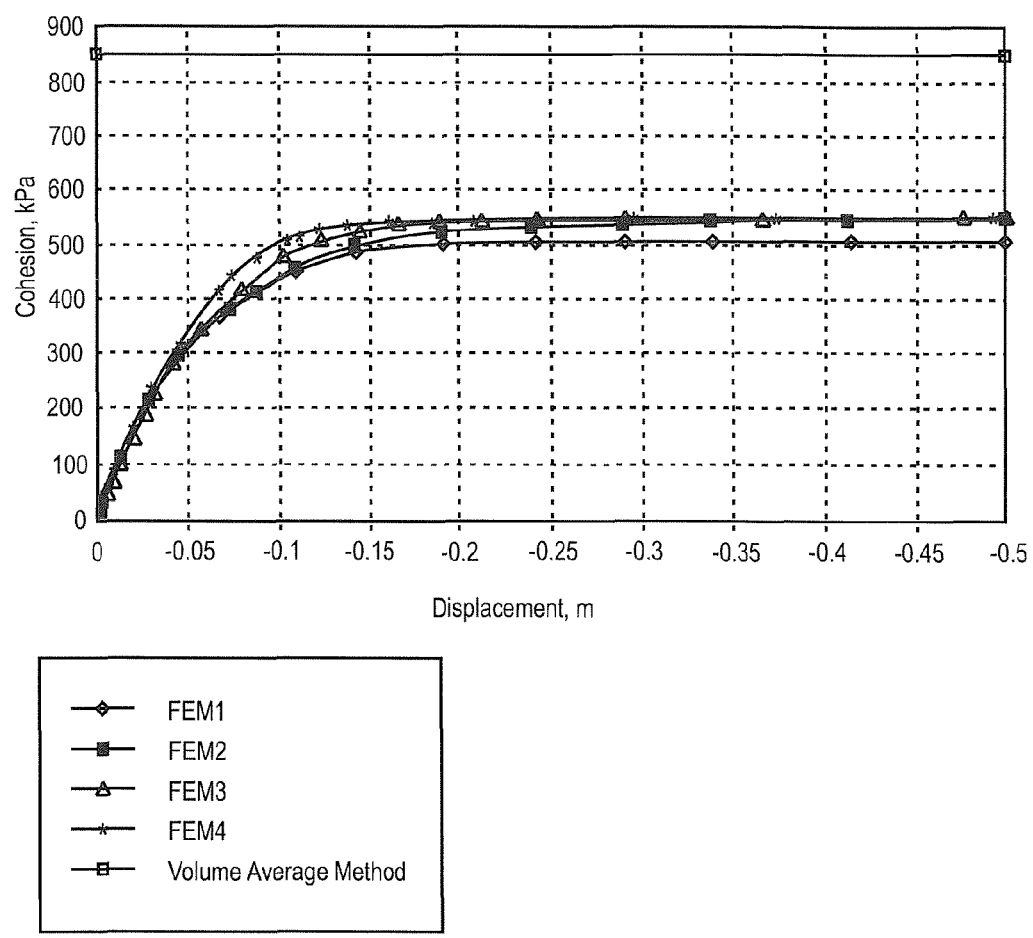
FIG. 17 is a graph that shows the upscaled cohesion of the coarse cell.

FIG. 17 is a graph that shows the upscaled cohesion of the coarse cell 1404 plotted against displacement. The final displacement-independent value can be taken as the homogenized cohesion value. Results from four typical analyses out of the 32 analyses performed are shown in FIG. 15. The upscaled cohesion computed from the 32 analyses performed was found to vary by only 7.5%. The results imply that the spatial arrangement has less impact on upscaled cohesion. The results also show that there is very little anisotropy in strength. This is in contrast with elastic upscaling results.

FIG. 17 also shows the upscaled cohesion computed according to the volume-average method as shown in the formula below.

$$\text{Upscaled\_Cohesion} = \frac{\Sigma \text{volume} - \text{cohesion}}{\text{total\_volume}} \quad \text{(Equation 16)}$$

The value predicted by FEM (the upper bound value) is much lower than the volume-average value. The FEM correctly predicts a lower value because the overall strength is controlled by the weaker parts of the model, whereas the volume-average method assigns equal weighting to all the strength values.

Experimental Results—Upscaling of Friction Angle

For the upscaling of the friction angle, several finite element analyses were carried out using the finite element mesh shown in FIG. 14. The variables were initial confining stresses, different force/displacement path, and spatial position of the fine cells 1402. The elastic properties and cohesion values were held constant, but friction angle values from 20 to 40 degrees were randomly assigned to various fine cells 1402. Two adjacent sides of the coarse cell 1404 were supported in normal directions. In the first step, the other two sides were supported with the values of initial confining stress. In the second step, the other two sides were subjected to various stress paths. Based on the global stress-strain response, the confining and failure stresses were computed. The confining stress and failure stress were used to calculate upscaled shear and mean stresses. The results of this analysis are shown in FIG. 18.

Figure 18:
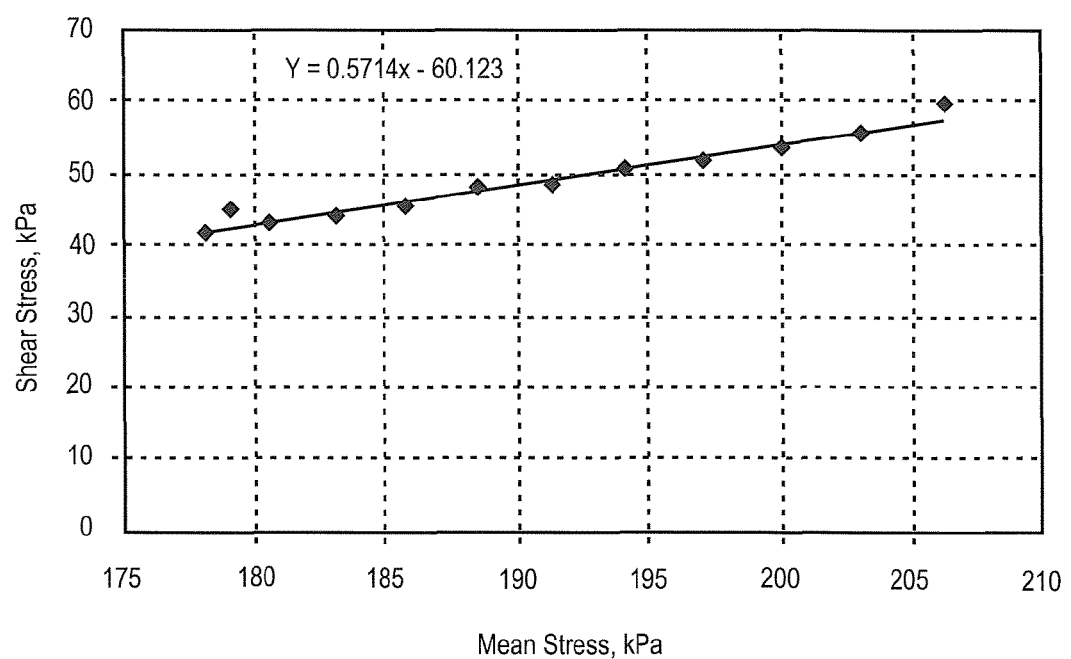
FIG. 18 is a graph that shows stress points and a trend line computed for the coarse cell and used to determine the upscaled friction angle of brittle failure surface.

FIG. 18 is a graph that shows stress points and a trend line computed for the coarse cell 1404 and used to determine the upscaled friction angle. As shown in FIG. 18, the homogenized friction angle was determined to be about 29 degrees, again influenced by the lower values. The results in FIG. 18 also include failure states from both horizontal as well as vertical loading. The linear trend indicates that there is very little anisotropy in frictional angle.

Experimental Results—Upscaling of Pre-Consolidation Pressure

For the upscaling of pre-consolidation pressure, a component of the elasto-plastic model, finite element analyses were performed using the finite element mesh shown in FIG. 14. During the analysis, the elastic and plastic values were assumed to be constant. Pre-consolidation pressure values of 1000 kPa to 16000 kPa in the increments of 1000 kPa were assigned to various fine cells 1402. These values may be obtained from fine cells within the geologic model. Two adjacent sides of the coarse cell 1404 were supported in normal directions. In the first step, the other two sides of the coarse cell 1404 were supported with the values of initial confining stress. In the second step, the other two sides of the coarse cell 1404 were subjected to various stress paths. Based on the global stress-strain response, the confining and failure stresses were computed. The confining stress and failure stress were used to calculate upscaled shear and upscaled mean stresses. The results of this analysis are shown in FIG. 19.

Figure 19:
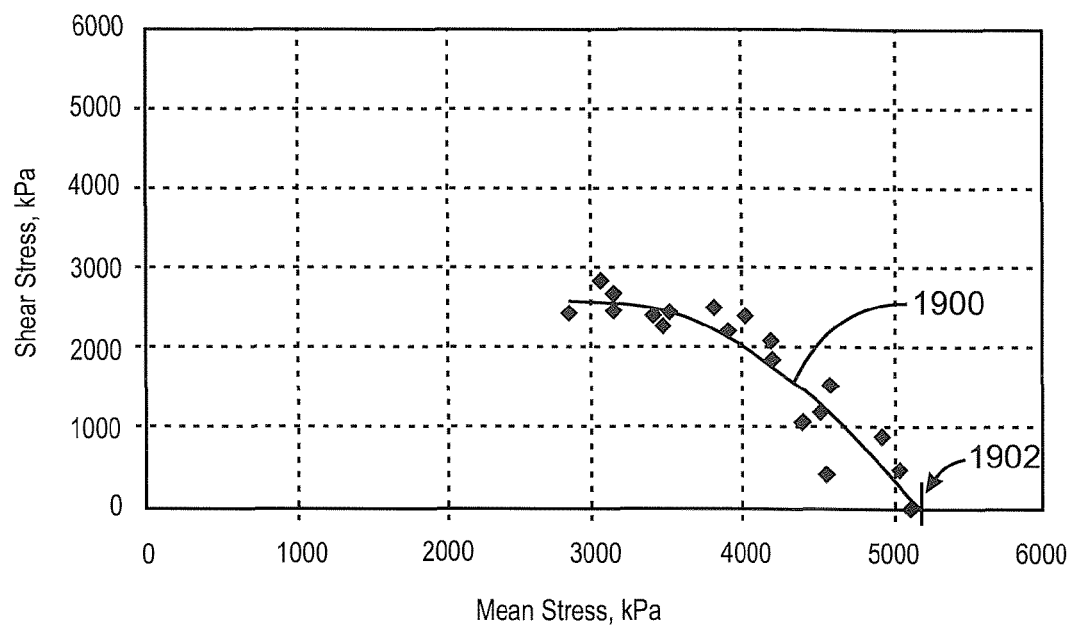
FIG. 19 is a graph that shows the stress points and a trend line computed for the coarse cell and used to determine the upscaled pre-consolidation pressure and ductile failure surface.

FIG. 19 is a graph that shows the stress points and a trend line 1900 computed for the coarse cell 1404 and used to determine the upscaled pre-consolidation pressure. The upscaled pre-consolidation pressure is noted by line 1902, which corresponds with the intersection of the trend line 1900 and the x-axis where the sheer stress equals zero. The upscaled pre-consolidation pressure was about 5000 kPa closer to the smallest values in the model indicating that upscaled pre-consolidation pressure was influenced more by the weaker parts of the model.

While the present techniques may be susceptible to various modifications and alternative forms, the exemplary embodiments discussed above have been shown only by way of example. However, it should again be understood that the present techniques are not intended to be limited to the particular embodiments disclosed herein. Indeed, the present techniques include all alternatives, modifications, and equivalents falling within the true spirit and scope of the appended claims.

What is claimed is:

1. A method for upscaling geomechanical properties, comprising:
   mapping fine cells from a geological model to a coarse cell from a geomechanical model;
   assigning mechanical properties to each of the fine cells based, at least in part, on the geological model, wherein the mechanical properties comprise elastic and plastic parameters of the geomaterials represented by the fine cell;
   simulating material response characteristics of the coarse cell to various boundary conditions based on the mechanical properties assigned to each of the fine cells; and
   computing upscaled mechanical properties of the coarse cell based on the material response characteristics of the coarse cell.

2. The method of claim 1, wherein the simulating material response characteristics of the coarse cell comprises applying a uniform displacement to a face of the coarse cell and computing a corresponding normal force.

3. The method of claim 1, wherein simulating material response characteristics of the coarse cell comprises:
   obtaining a first load/displacement data set by applying a uniform displacement to a face of the coarse cell and computing a corresponding normal force;
   obtaining a second load/displacement data set by applying the normal force to the face of the coarse cell and computing the corresponding uniform displacement; and
   obtaining a third load/displacement data set by averaging the first load/displacement data set and the second load/displacement data set.

4. The method of claim 1, wherein simulating material response characteristics of the coarse cell to various boundary conditions comprises computing two or more stress paths, wherein each stress path corresponds to a different initial loading condition.

5. The method of claim 4, wherein computing upscaled mechanical properties of the coarse cell comprises identifying a failure point for each stress path and connecting the failure points by a best fit linear line to determining a Mohr-Coulomb surface corresponding to coarse cell.

6. The method of claim 1, wherein computing upscaled mechanical properties of the coarse cell comprises computing plastic and elastic mechanical properties of the coarse cell based on the material response characteristics of the coarse cell.

7. The method of claim 1, wherein simulating material response characteristics of the coarse cell comprises computing peak failure points of various stress paths, wherein each stress path corresponds to a different initial confining stresses or loading direction.

8. The method of claim 7, wherein computing upscaled mechanical properties of the coarse cell comprises identifying a brittle failure surface and a ductile failure surface based on the peak failure points.

9. The method of claim 1, wherein simulating material response characteristics of the coarse cell comprises computing incremental plastic strain vectors at a failure point of two or more stress paths.

10. The method of claim 9, wherein computing upscaled mechanical properties of the coarse cell comprises computing a plastic potential surface based on the incremental plastic strain vectors.

11. A method of modeling fluid flow in a hydrocarbon reservoir, comprising:
    mapping fine cells from a geological model to a coarse cell from a geomechanical model;
    assigning mechanical and hydraulic properties to each of the fine cells based on the geological model, wherein the mechanical properties comprise elastic and plastic parameters of the geomaterials represented by the fine cell;
    simulating material response characteristics of the coarse cell to various boundary conditions based on the mechanical and hydraulic properties assigned to each of the fine cells;
    computing upscaled elastic and plastic properties of the coarse cell based on the material response characteristics of the coarse cell;
    generating a fluid flow model based on the geological model;
    simulating the geomechanical model using the upscaled elastic and plastic properties of the coarse cell to determine physical properties that affect the fluid flow model; and
    simulating the fluid flow model based, in part, on the physical properties.

12. The method of claim 11, comprising determining a pore pressure based on a solution to the simulation of the fluid flow model, and simulating the geomechanical model based, in part, on the pore pressure.

13. A method for producing a hydrocarbon from a hydrocarbon reservoir, comprising:
    mapping fine cells from a geological model to a coarse cell from a geomechanical model;
    assigning mechanical properties to each of the fine cells based on the geological model, wherein the mechanical properties comprise elastic and plastic parameters of the geomaterials represented by the fine cell;
    simulating material response characteristics of the coarse cell to various boundary conditions based on the mechanical properties assigned to each of the fine cells;
    computing upscaled elastic and plastic properties of the coarse cell based on the material response characteristics of the coarse cell;
    performing a coupled reservoir simulation of the hydrocarbon reservoir using the upscaled elastic and plastic properties obtained for the coarse cell; and
    producing a hydrocarbon from the hydrocarbon reservoir based, at least in part, upon the results of the coupled reservoir simulation.

14. The method of claim 13, wherein producing the hydrocarbon comprises:
    drilling one or more wells to the hydrocarbon reservoir, wherein the wells comprise production wells, injection wells, or both;
    setting production rates from the hydrocarbon reservoir; or
    any combinations thereof.

15. A system for modelling reservoir properties, comprising:
    a processor;
    a storage medium that stores a geological model of a reservoir comprising a matrix of fine cells with associated mechanical properties, wherein the mechanical properties comprise elastic and plastic parameters of the geomaterials represented by the fine cell; and
    a non-transitory machine readable medium comprising code configured to direct the processor to:
        map a plurality of fine cells from the geological model to a coarse cell from a geomechanical model;
        simulate material response characteristics of the coarse cell to various boundary conditions based on the mechanical properties associated with each of the fine cells;
        compute upscaled mechanical properties of the coarse cell based on the material response characteristics of the coarse cell; and
        store the upscaled mechanical properties to the storage medium as characteristics of the geomechanical model.

16. The method of claim 15, comprising code configured to direct the processor to simulate the material response characteristics of the coarse cell by computing two or more stress paths, wherein each stress path corresponds to a different initial loading condition.

17. The method of claim 16, comprising code configured to direct the processor to compute the upscaled mechanical properties of the coarse cell by identifying a failure point for each stress path and connecting the failure points by a best fit linear line to determining a Mohr-Coulomb surface corresponding to coarse cell.

18. The method of claim 15, comprising code configured to direct the processor to:
    simulate the material response characteristics of the coarse cell by computing peak failure points of various stress paths, wherein each stress path corresponds to a different initial confining stresses or loading direction; and
    compute the upscaled mechanical properties of the coarse cell by identifying a brittle failure surface and a ductile failure surface based on the peak failure points.

19. The method of claim 15, comprising code configured to direct the processor to:
    simulate the material response characteristics of the coarse cell by computing incremental plastic strain vectors at a failure point of two or more stress paths; and
    compute upscaled mechanical properties of the coarse cell by computing a plastic potential surface based on the incremental plastic strain vectors.

20. The method of claim 15, wherein the geological model includes a discontinuity which is represented in the coarse cell by a master-slave contact algorithm and simulating the material response characteristics of the coarse cell includes computing a solution to the master-slave contact algorithm.

21. A non-transitory computer-readable medium comprising code configured to direct a processor to:
    map a plurality of fine cells from a geological model to a coarse cell from a geomechanical model, wherein each fine cell in the plurality of fine cells is associated with a mechanical property, wherein the mechanical properties comprise elastic and plastic parameters of the geomaterials represented by the fine cell;
    simulate material response characteristics of the coarse cell to various boundary conditions based on the mechanical property associated with each fine cell;
    compute upscaled mechanical properties of the coarse cell based on the material response characteristics of the coarse cell; and
    store the upscaled mechanical properties to the storage medium as characteristics of the geomechanical model.

22. The non-transitory computer-readable medium of claim 21 comprising code configured to direct a processor to:
  receive the various boundary conditions to be applied to one or more faces of the coarse cell;
  simulate the material response characteristics of the coarse cell by computing load/displacement data of the coarse cell based, at least in part, on the various boundary conditions and the mechanical property associated with each fine cell.

23. The non-transitory computer-readable medium of claim 22 comprising code configured to direct a processor to develop a plasticity model of the coarse cell based, at least in part, on the load/displacement data.

24. The non-transitory computer-readable medium of claim 22, wherein the load/displacement data is used to compute plastic and elastic mechanical properties of the coarse cell.

25. The non-transitory computer-readable medium of claim 21, comprising code configured to direct a processor to compute a plurality of stress paths for the coarse cell and identify a Mohr-Coulomb surface based on the plurality of stress paths.

* * * * *